(12) United States Patent
Joe et al.

(10) Patent No.: US 9,046,583 B2
(45) Date of Patent: **\*Jun. 2, 2015**

(54) APPARATUS AND METHOD FOR ESTIMATING VOLTAGE OF SECONDARY BATTERY INCLUDING BLENDED MATERIAL IN ELECTRODE

(71) Applicant: LG Chem, Ltd., Seoul (KR)

(72) Inventors: Won-Tae Joe, Daejeon (KR); Geun-Chang Chung, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/134,315

(22) Filed: Dec. 19, 2013

(65) Prior Publication Data

US 2014/0132222 A1 May 15, 2014

Related U.S. Application Data

(63) Continuation-in-part of application No. 13/973,367, filed on Aug. 22, 2013, now Pat. No. 8,653,794, which is a continuation of application No. PCT/KR2013/002151, filed on Mar. 15, 2013.

(30) Foreign Application Priority Data

Jun. 13, 2012 (KR) .................. 10-2012-0063338
Mar. 15, 2013 (KR) .................. 10-2013-0028148

(51) Int. Cl.
*H02J 7/00* (2006.01)
*G01R 31/36* (2006.01)
*H01M 10/48* (2006.01)

(52) U.S. Cl.
CPC ........ *G01R 31/3651* (2013.01); *G01R 31/3665* (2013.01); *G01R 31/3606* (2013.01); *H01M 10/48* (2013.01)

(58) Field of Classification Search
CPC ...................................... H02J 7/0031
USPC ........................................ 320/134
See application file for complete search history.

(56) References Cited

U.S. PATENT DOCUMENTS 6,265,848 B1 * 7/2001 Mukainakano ............... 320/132
6,483,274 B2 * 11/2002 Lee ............................... 320/132

(Continued)

FOREIGN PATENT DOCUMENTS

JP 2008-243373 A 10/2008
JP 2010-203854 A 9/2010

(Continued)

OTHER PUBLICATIONS

International Search Report for PCT/KR2013/002151 mailed on Jun. 27, 2013.

(Continued)

*Primary Examiner* — Yalkew Fantu
(74) *Attorney, Agent, or Firm* — Birch, Stewart, Kolasch & Birch, LLP

(57) ABSTRACT

Disclosed is an apparatus for estimating a voltage of a secondary battery which includes a cathode comprising a first cathode material and a second cathode material with different operating voltage ranges, an anode comprising an anode material and a separator for separating the cathode from the anode. The apparatus comprises a control unit configured to estimate a voltage of a secondary battery based on a circuit model including a first cathode material circuit, a second cathode material circuit and an anode material circuit, each circuit modeled to change its voltage according to State Of Charge (SOC) of the electrode material corresponding the circuit and a current flowing through the circuit.

16 Claims, 5 Drawing Sheets

(56) References Cited

U.S. PATENT DOCUMENTS

| | | | |
|---|---|---|---|
| 6,534,954 B1 * | 3/2003 | Plett | 320/132 |
| 6,829,562 B2 * | 12/2004 | Sarfert | 702/182 |
| 7,630,842 B2 | 12/2009 | Murakami | |
| 8,093,902 B2 | 1/2012 | Nishi et al. | |
| 2002/0168574 A1 * | 11/2002 | Ahn et al. | 429/232 |
| 2005/0046388 A1 * | 3/2005 | Tate et al. | 320/132 |
| 2009/0070052 A1 * | 3/2009 | Taniguchi et al. | 702/63 |
| 2012/0219840 A1 | 8/2012 | Choi et al. | |
| 2012/0310563 A1 | 12/2012 | Shigemizu et al. | |
| 2013/0116954 A1 | 5/2013 | Tazoe et al. | |

FOREIGN PATENT DOCUMENTS

| | | |
|---|---|---|
| JP | 2012-42457 A | 3/2012 |
| KR | 10-2007-0103406 A | 10/2007 |
| KR | 10-2010-0057605 A | 5/2010 |
| KR | 10-2012-0049875 A | 5/2012 |
| KR | 10-1147602 B1 | 5/2012 |
| WO | WO 2009/009758 A2 | 1/2009 |
| WO | WO 2012/011472 A1 | 1/2012 |

OTHER PUBLICATIONS

Written Opinion of the International Searching Authority for PCT/KR2013/002151 mailed on Jun. 27, 2013.

* cited by examiner

APPARATUS AND METHOD FOR ESTIMATING VOLTAGE OF SECONDARY BATTERY INCLUDING BLENDED MATERIAL IN ELECTRODE

CROSS-REFERENCE TO RELATED APPLICATION

The present application is a Continuation-In-Part (CIP) application of U.S. application Ser. No. 13/973,367 filed on Aug. 22, 2013, which is a Continuation application of International Application No. PCT/KR2013/002151 filed on Mar. 15, 2013, which claims priority to Korean Patent Application No. 10-2012-0063338 filed on Jun. 13, 2012, and Korean Patent Application No. 10-2013-0028148 filed on Mar. 15, 2013, in the Republic of Korea, the disclosures of which are incorporated herein by reference.

TECHNICAL FIELD

The present disclosure relates to a method and apparatus capable of estimating a voltage of a secondary battery.

BACKGROUND ART

A battery generates electric energy by oxidation and reduction reactions and is widely used in various ways. For example, a battery is applied to portable devices such as cellular phones, laptops, digital cameras, video cameras, tablet computers, and electric tools; electric-driven apparatuses such as electric bikes, motor cycles, electric vehicles, hybrid vehicles, electric ships, and electric airplanes; power storage devices used for storing power generated by new regeneration energy or surplus energy in a power grid; uninterrupted power supplies for stably supplying power to various information communication devices such as server computers and base stations for communication, and so on.

A battery includes three basic components: an anode containing material which is oxidized while emitting electrons during discharge, a cathode containing material which is reduced while accepting electrons during discharge, and an electrolyte allowing the transfer of operating ions between the anode and the cathode.

Batteries may be classified into primary batteries which are not reusable after discharge, and secondary batteries which allow repeated charge and discharge since their electrochemical reaction is at least partially reversible.

The secondary batteries include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries and so on, as well known in the art. Among them, lithium secondary batteries are drawing the most attention due to their high energy density, high battery voltage and long life cycle in comparison to other secondary batteries.

In the lithium secondary battery, the material used as the cathode material greatly influences the performance of the secondary battery. Therefore, various attempts are being made to provide cathode materials having low production costs and large energy capacity while maintaining high-temperature stability.

DISCLOSURE

Technical Problem

The present disclosure is designed to solve the problems of the related art, and therefore the present disclosure is directed to providing a blended cathode material in which at least two cathode materials are blended to supplement weaknesses of individual cathode materials, and an apparatus and method capable of estimating a voltage of a secondary battery including the blended cathode material.

Technical Solution

The voltage estimating apparatus of a secondary battery according to the present disclosure estimates a voltage of a secondary battery which includes a cathode containing a blended cathode material, an anode containing an anode material and a separator for separating the cathode and the anode from each other.

Here, the blended cathode material includes at least a first cathode material and a second cathode material which have different operating voltage ranges. For example, when the secondary battery is in a discharge mode, the first cathode material is activated at a relatively higher voltage range in comparison to the second cathode material, and when the secondary battery is in a charge mode, the second cathode material is activated at a relatively lower voltage range in comparison to the first cathode material. Here, activation of the first cathode material or the second cathode material means that the corresponding cathode material reacts with operating ions. Therefore, the concentration of operating ions reacting with the first cathode material and the concentration of operating ions reacting with the second cathode material vary according to the voltage of the secondary battery.

The operating ions mean ions performing an electrochemical reaction with the first and second cathode materials when a secondary battery having the blended cathode material is being charged or discharged. The operating ions may vary depending on the kind of the secondary battery. For example, the operating ions may be lithium ions in the case of a lithium secondary battery. Hereinafter, the operation of a secondary battery is defined as meaning charge or discharge of the secondary battery, unless stated otherwise.

This reaction means an electrochemical reaction including oxidation and reduction reactions of the first and second cathode materials accompanied with the operation of the secondary battery and may vary according to an operating mechanism of the secondary battery. In an embodiment, the electrochemical reaction may mean that operating ions are intercalated into or deintercalated from the first cathode material and/or the second cathode material. In this case, the concentration of operating ions intercalated into the first and second cathode materials or the concentration of operating ions deintercalated from the first and second cathode materials may vary according to the change of voltage of the secondary battery. For example, under the condition where the secondary battery is discharged, at a certain voltage range, operating ions may be preferentially intercalated into the first cathode material rather than the second cathode material, and at another voltage range, it may be the opposite. As another example, under the condition where the secondary battery is charged, at a certain voltage range, operating ions may be preferentially deintercalated from the second cathode material rather than the first cathode material, and at another voltage range, it may be the opposite.

In an embodiment, in order to satisfy the condition that the concentrations of operating ions reacting with the first and second cathode materials are different from each other, the first and second cathode materials may satisfy at least one of the following conditions.

For example, when dQ/dV distribution of the first and second cathode materials is measured, locations and/or intensities of main peaks exhibited in the dQ/dV distribution of the cathode materials may be different from each other.

Here, the dQ/dV distribution means capacity characteristics of the cathode material in accordance with voltages of operating ions. Locations of the main peaks of the dQ/dV distribution may vary according to the kind of the first and second cathode materials.

As another example, when a discharge resistance is measured while a state of charge of the secondary battery including the first and second cathode materials is changed between 0~100%, a discharge resistance profile may have a convex pattern (so-called a protruding shape).

Here, the state of charge means an amount of available electric energy stored in the secondary battery and is known as a parameter 'SOC' in the art. The state of charge may express its value quantitatively by using parameters "SOC" and "z". The SOC parameter is used when expressing the 'state of charge' as a percentage value between 0% and 100%, and the z parameter is used when expressing the 'state of charge' as a numerical value between 0 and 1. The state of charge may be measured by means of ampere counting or the like, without being limited thereto.

As another example, when a discharge resistance of each SOC is measured with respect to the secondary battery including the first and second cathode materials, a discharge resistance profile may have at least two inflection points before and after the peak of the convex pattern.

As another example, when the secondary battery including the first and second cathode materials is charged or discharged, a charge or discharge profile may have at least one voltage plateau. Here, the voltage plateau means a voltage range where an inflection point is present and a voltage change is small before and after the inflection point.

As another example, at least one of the first and second cathode materials may have a voltage profile with a voltage plateau.

In an embodiment, the first cathode material may be an alkali metal compound expressed by a general chemical formula $A[A_xM_y]O_{2+z}$ wherein A includes at least one of Li, Na and K; M includes at least one element selected from the group consisting of Ni, Co, Mn, Ca, Mg, Al, Ti, Si, Fe, Mo, V, Zr, Zn, Cu, Al, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the alkali metal compound maintains electrical neutrality.

Alternatively, the first cathode material may be an alkali metal compound expressed by $xLiM^1O_2-(1-x)Li_2M^2O_3$ wherein $M^1$ includes at least one element with an average oxidation state of +3; $M^2$ includes at least one element with an average oxidation state of +4; and $0 \leq x \leq 1$, which is disclosed in U.S. Pat. No. 6,677,082, U.S. Pat. No. 6,680,143 or the like.

In another embodiment, the second cathode material may be lithium metal phosphate expressed by a general chemical formula $Li_aM^1_xFe_{1-x}M^2_yP_{1-y}M^3_zO_{4-z}$, wherein $M^1$ includes at least one element selected from the group consisting of Ti, Si, Mn, Co, Fe, V, Cr, Mo, Ni, Nd, Mg and Al; $M^2$ includes at least one element selected from the group consisting of Ti, Si, Mn, Co, Fe, V, Cr, Mo, Ni, Nd, Al, Mg, Al, As, Sb, Si, Ge, V and S; $M^3$ includes at least one element selected from a halogen group containing F; $0<a\leq 2$, $0\leq x\leq 1$, $0\leq y<1$, $0\leq z<1$; and a, x, y, z, and stoichiometric coefficients of the components included in $M^1_z$, $M^2_y$, and $M^3_z$ are selected so that the lithium metal phosphate maintains electrical neutrality, or $Li_3M_2(PO_4)_3$, wherein M includes at least one element selected from the group consisting of Ti, Si, Mn, Fe, Co, V, Cr, Mo, Ni, Mg and Al.

In another embodiment, the first cathode material may be $Li[Li_aNi_bCo_cMn_d]O_{2+z}$ ($a\geq 0$; $a+b+c+d=1$; at least one of b, c and d is not zero; $-0.1 \leq z \leq 2$). In addition, the second cathode material may be at least one selected from the group consisting of $LiFePO_4$, $LiMn_xFe_yPO_4$ ($0<x+y\leq 1$) and $Li_3Fe_2(PO_4)_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, Fe, V, Cr, Mo, Ni, Nd, Al, Mg, Al, As, Sb, Si, Ge, V and S.

In the present disclosure, a blending ratio of the first and second cathode materials may be suitably adjusted according to an electrochemical design condition considering the use of a secondary battery to be manufactured.

In addition, the number of cathode materials capable of being included in the blended cathode material is not limited to two. In an embodiment, the blended cathode material may include three kinds of cathode materials different from each other, for example a blended cathode material including $LiMn_2O_4$, $Li[Li_aNi_xCo_yMn_z]O_2$ [$a\geq 0$; $a+x+y+z=1$; at least one of x, y and z is not zero] and $LiFePO_4$. In another embodiment, the blended cathode material may have four kinds of cathode materials different from each other, for example a blended cathode material including $LiNiO_2$, $LiMn_2O_4$, $Li[Li_aNi_xCo_yMn_z]O_2$ [$a\geq 0$; $a+x+y+z=1$; at least one of x, y and z is not zero] and $LiFePO_4$. In addition, in order to improve properties of the blended cathode material, other additives such as a conducting agent and a binder may be added to the blended cathode material without special restriction.

In the present disclosure, the blended cathode material may be used as a cathode material of a secondary battery loaded on various kinds of electric-driven apparatuses driven by electric energy, and the kind of the electric-driven apparatus is not specially limited.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy in the power grid, or an uninterrupted power supply device for supplying power to various information communication devices such as server computers and mobile communication devices in times of emergency such as a blackout.

According to the present disclosure, the voltage estimating apparatus of a secondary battery may include a control unit which estimates a voltage of a secondary battery, formed between a cathode and an anode of the secondary battery, by using a circuit model, and a sensor configured to measure an operation initiating voltage of the secondary battery when the secondary battery initiates operation, measure a current of the secondary battery at time intervals during the operation of the secondary battery, and provide the measured operation initiating voltage and the measured current of the secondary battery to the control unit.

Selectively, the sensor may measure a voltage of the secondary battery at time intervals during the operation of the secondary battery and further provide the measured voltage to the control unit.

Selectively, the voltage estimating apparatus of a secondary battery may further include a storage unit in which the measured operation initiating voltage, the measured voltage of the secondary battery, the measured current of the secondary battery, and the estimated voltage of the secondary battery are stored.

Here, the initiation of operation of the secondary battery means that the secondary battery whose charge or discharge was interrupted initiates charging or discharging.

In an embodiment, the circuit model includes a first cathode material circuit having an open-circuit voltage component and an impedance component corresponding to the first cathode material, a second cathode material circuit connected to the first cathode material circuit in parallel and having an open-circuit voltage component and an impedance component corresponding to the second cathode material, and an anode material circuit connected to the first and second cathode material circuits in series and having an open-circuit voltage component and an impedance component corresponding to the anode material. Here, the open-circuit voltage components and the impedance components respectively included in the first cathode material circuit, the second cathode material circuit and the anode material circuit may be connected in series.

In an embodiment, the control unit may estimate a voltage of the secondary battery, formed between the cathode and the anode, by calculating a current flowing through each circuit and voltages formed at the open-circuit voltage component and the impedance component included in each circuit while the secondary battery is being charged or discharged, based on the circuit model.

In another embodiment, the control unit may vary each SOC of the first cathode material, the second cathode material and the anode material by integrating currents respectively flowing through the first cathode material circuit, the second cathode material circuit and the anode material circuit. In addition, the control unit may vary voltages respectively formed at the open-circuit voltage components included in the first cathode material circuit, the second cathode material circuit and the anode material circuit according to SOC of the first cathode material, SOC of the second cathode material and SOC of the anode material.

In another embodiment, the control unit may vary a voltage formed at the impedance component of each circuit according to a current flowing through each circuit by using an impedance voltage calculation equation which is derived from a connection relation and an electrical characteristic value of a circuit element constituting the impedance component included in each circuit. Here, the electrical characteristic value is a resistance value, a capacitance value or an inductance value.

As a non-limiting example, the control unit may estimate a voltage of the secondary battery by using the discrete time equations below.

$$V_{cell}[k] = V_{cathode}[k] - V_{anode}[k];$$

$$V_{cathode}[k] = f(V_{c1}[k], V_{c2}[k], i_{cell}[k], \ldots);$$

$$V_{anode}[k] = g(V_a[k], i_{cell}[k], \ldots);$$

$$V_{c1}[k] = OCV_{c1}(z_{c1}[k]) + V_{impedance\_c1}[k];$$

$$V_{c2}[k] = OCV_{c2}(z_{c2}[k]) + V_{impedance\_c2}[k]; \text{ and}$$

$$V_a[k] = OCV_a(z_a[k]) + V_{impedance\_a}[k];$$

Here, $V_{cell}[k]$, $V_{cathode}[k]$ and $V_{anode}[k]$ respectively represent an estimated voltage of the secondary battery, an estimated voltage of the cathode and an estimated voltage of the anode. $z_{c1}[k]$, $z_{c2}[k]$ and $z_a[k]$ respectively represent SOC of the first cathode material, the second cathode material and the anode material. $OCV_{c1}$, $OCV_{c2}$, and $OCV_a$ are respectively operators for calculating voltages formed by the open-circuit voltage components included in the first cathode material circuit, the second cathode material circuit and the anode material circuit according to SOC variation of the first cathode material circuit, the second cathode material circuit and the anode material circuit. $V_{impedance\_c1}$, $V_{impedance\_c2}$, and $V_{impedance\_a}$ are respectively operators for calculating voltages formed by the impedance components included in the first cathode material circuit, the second cathode material circuit and the anode material circuit. $i_{cell}[k]$ represents a current of the secondary battery, measured by the sensor, and has a positive value when the secondary battery is being discharged and a negative value when the secondary battery is being charged. The function f is a cathode voltage estimating equation derived from the circuit model and may be derived by means of a circuit analysis of the first cathode material circuit and the second cathode material circuit. The function g is an anode voltage estimating equation derived from the circuit model and may be derived by means of a circuit analysis of the anode material circuit. k represents a time index which increases whenever the time Δt passes.

As a non-limiting example, the control unit may vary $z_{c1}[k]$, $z_{c2}[k]$ and $z_a[k]$ according to time by using the discrete time equations below.

The discrete time equations below are derived based on an ampere counting method.

$$z_{c1}[k+1] = z_{c1}[k] + i_{c1}[k]\Delta t / Q_{c1}$$

$$z_{c2}[k+1] = z_{c2}[k] + i_{c2}[k]\Delta t / Q_{c2}$$

$$z_a[k+1] = z_a[k] - i_a[k]\Delta t / Q_a = z_a[k] - i_{cell}[k]\Delta t / Q_a$$

Here, $i_{c1}[k]$, $i_{c2}[k]$ and $i_a[k]$ respectively represent currents flowing through the first cathode material circuit, the second cathode material circuit and the anode material circuit during a time interval of Δt, and $i_a[k]$ is identical to $i_{cell}[k]$ which is the current of the secondary battery. $i_{c1}[k]$ and $i_{c2}[k]$ have negative values when the secondary battery is being discharged and have positive values when the secondary battery is being charged. $Q_{c1}$ and $Q_{c2}$ are respectively parameters representing gross capacities (Ah) of the first cathode material and the second cathode material where operating ions may be intercalated or deintercalated, and $Q_a$ is a parameter representing a gross capacity (Ah) of the anode material where operating ions may be intercalated or deintercalated.

As a non-limiting example, the control unit may set initial conditions of $z_{c1}[k]$, $z_{c2}[k]$ and $z_a[k]$ like the following equations.

$$z_{c1}[0] = OCV^{-1}_{c1}(V_{cell}[0] + OCV_a(OCV^{-1}_{cell}(V_{cell}[0])))$$

$$z_{c2}[0] = OCV^{-1}_{c2}(V_{cell}[0] + OCV_a(OCV^{-1}_{cell}(V_{cell}[0])))$$

$$z_a[0] = z_{cell}[0] = OCV^{-1}_{cell}(V_{cell}[0])$$

Here, $OCV^{-1}_{c1}$, $OCV^{-1}_{c2}$, and $OCV^{-1}_{cell}$ are respectively inverse transformation operators of $OCV_{c1}$, $OCV_{c2}$ and $OCV_{cell}$. In addition, $OCV_{c1}$, $OCV_{c2}$ and $OCV_{cell}$ are respectively operators for transforming SOC of the first cathode material, the second cathode material and the secondary battery into open-circuit voltages. $V_{cell}[0]$ is an operation initiating voltage measured by the sensor when the secondary battery initiates operation.

As a non-limiting example, the first cathode material circuit, the second cathode material circuit and the anode material circuit may include at least a RC circuit as the impedance component. In this case, the control unit may vary an impedance voltage formed by the RC circuit according to time by using impedance voltage calculation equations expressed below as discrete time equations.

$$V_{RC\_c1}[k+1] = V_{RC\_c1}[k]e^{-\frac{\Delta t}{R_{c1}C_{c1}}} + R_{c1}\left(1 - e^{-\frac{\Delta t}{R_{c1}C_{c1}}}\right)i_{c1}[k]$$

$$V_{RC\_c2}[k+1] = V_{RC\_c2}[k]e^{-\frac{\Delta t}{R_{c2}C_{c2}}} + R_{c2}\left(1 - e^{-\frac{\Delta t}{R_{c2}C_{c2}}}\right)i_{c2}[k]$$

$$V_{RC\_a}[k+1] = V_{RC\_a}[k]e^{-\frac{\Delta t}{R_{a}C_{a}}} + R_{a}\left(1 - e^{-\frac{\Delta t}{R_{a}C_{a}}}\right)i_{cell}[k]$$

Here, $V_{RC\_C1}[k]$, $V_{RC\_C2}[k]$ and $V_{RC\_a}[k]$ respectively represent impedance voltages formed by the RC circuits included in the impedance components of the first cathode material circuit, the second cathode material circuit and the anode material circuit. $R_{c1}$ and $C_{c1}$ respectively represent a resistance value and a capacitance value of a resistance element and a capacity element of the RC circuit included in the first cathode material circuit. $R_{c2}$ and $C_{c2}$ respectively represent a resistance value and a capacitance value of a resistance element and a capacity element of the RC circuit included in the second cathode material circuit. $R_a$ and $C_a$ respectively represent a resistance value and a capacitance value of a resistance element and a capacity element of the RC circuit included in the anode material circuit. $i_{c1}[k]$, $i_{c2}[k]$ and $i_{cell}[k]$ respectively represent a current flowing through the first cathode material circuit, a current flowing through the second cathode material circuit and a current of the secondary battery.

As a non-limiting example, the control unit may set initial values of the voltages formed by the RC circuits included in the impedance components of the first cathode material circuit, the second cathode material circuit and the anode material circuit as follows.

$$V_{RC\_C1}[0] = V_{RC\_C2}[0] = V_{RC\_a}[k] = 0$$

Selectively, the first cathode material circuit, the second cathode material circuit and the anode material circuit may further include resistors connected to the RC circuits in series as the impedance components.

In an embodiment, the control unit may update $z_{c1}[k]$, $z_{c2}[k]$ and $z_a[k]$ into $z_{c1}[k+1]$, $z_{c2}[k+1]$ and $z_a[k+1]$, respectively, whenever the time index k increases, update $V_{impedance\_c1}[k]$, $V_{impedance\_c2}[k]$ and $V_{impedance\_a}[k]$ into $V_{impedance\_c1}[k+1]$, $V_{impedance\_c2}[k+1]$ and $V_{impedance\_c1}[k+1]$, respectively, by using the impedance voltage calculation equation, and estimate $V_{cell}[k+1]$ by calculating $V_{cathode}[k+1]$ and $V_{anode}[k+1]$ from the updated values.

In another embodiment of the present disclosure, the control unit may estimate a voltage of the secondary battery, formed between the cathode and the anode, by calculating a current flowing through each circuit and a voltage formed at each circuit while the secondary battery is being charged or discharged, by using a first cathode material circuit modeled so that the voltage formed at the first cathode material varies according to SOC of the first cathode material and the impedance component of the first cathode material, a second cathode material circuit connected to the first cathode material circuit in parallel and modeled so that the voltage formed at the second cathode material varies according to SOC of the second cathode material and the impedance component of the second cathode material, and an anode material circuit connected to the first and second cathode material circuits in series and modeled so that the voltage formed at the anode material varies according to SOC of the anode material and the impedance component of the anode material.

As a non-limiting example, the control unit may calculate a voltage formed at the first cathode material circuit by adding an open-circuit voltage which varies according to SOC of the first cathode material and an impedance voltage which varies according to the impedance component of the first cathode material; a voltage formed at the second cathode material circuit by adding an open-circuit voltage which varies according to SOC of the second cathode material and an impedance voltage which varies according to the impedance component of the second cathode material; and a voltage formed at the anode material circuit by adding an open-circuit voltage which varies according to SOC of the anode material and an impedance voltage which varies according to the impedance component of the anode material.

In addition, as a non-limiting example, the control unit may calculate an open-circuit voltage corresponding to SOC of the first cathode material by using a look-up table or a look-up function in which the open-circuit voltage is defined in advance according to each SOC of the first cathode material; an open-circuit voltage corresponding to SOC of the second cathode material by using a look-up table or a look-up function in which the open-circuit voltage is defined in advance according to each SOC of the second cathode material; and an open-circuit voltage corresponding to SOC of the anode material by using a look-up table or a look-up function in which the open-circuit voltage is defined in advance according to each SOC of the anode material.

Moreover, as a non-limiting example, the control unit may calculate an impedance voltage formed at the impedance component of the first cathode material by using an impedance voltage calculation equation derived from a connection relation and an electrical characteristic value of a circuit element constituting the impedance component of the first cathode material and a current flowing through the first cathode material circuit; an impedance voltage formed at the impedance component of the second cathode material by using an impedance voltage calculation equation derived from a connection relation and an electrical characteristic value of a circuit element constituting the impedance component of the second cathode material and a current flowing through the second cathode material circuit; and an impedance voltage formed at the impedance component of the anode material by using an impedance voltage calculation equation derived from a connection relation and an electrical characteristic value of a circuit element constituting the impedance component of the anode material and a current flowing through the anode material circuit.

According to another embodiment of the present disclosure, the control unit may estimate a voltage of the secondary battery, formed between the cathode and the anode, by calculating a current flowing through each circuit and a voltage formed at each circuit by using a first cathode material circuit which models a voltage formed at the first cathode material according to the amount of operating ions intercalated into or deintercalated from the first cathode material, a second cathode material circuit which is connected to the first cathode material circuit in parallel and models a voltage formed at the second cathode material according to the amount of operating ions intercalated into or deintercalated from the second cathode material, and an anode material circuit which is connected to the first and second cathode material circuits in series and models a voltage formed at the anode material according to the amount of operating ions intercalated into or deintercalated from the anode material.

According to the present disclosure, the control unit may control operations of the secondary battery by using the estimated voltage of the secondary battery. In addition, the control unit may output the estimated voltage of the secondary battery. Moreover, the control unit may store the estimated voltage of the secondary battery.

The control unit may be a battery management system (BMS) which may be electrically coupled to a secondary battery, or a control element included in the BMS.

The BMS may be interpreted as meaning a typical BMS system in the art, but in the functional point of view, any system capable of performing at least one function disclosed in this specification may be included in the scope of the BMS.

The BMS may include the circuit model as a software algorithm which is executable by a processor. For example, the circuit model may be composed with program codes and stored in a memory device and executed by the processor.

According to another embodiment of the present disclosure, there is provided a method for estimating a voltage of a secondary battery which includes a cathode containing a first cathode material and a second cathode material with different operating voltage ranges, an anode containing an anode material and a separator for separating the cathode and the anode from each other, the method comprising: measuring a current of the secondary battery; calculating a current flowing through each circuit while a current of the secondary battery is flowing, by using a first cathode material circuit, a second cathode material circuit and an anode material circuit respectively corresponding to the first cathode material, the second cathode material and the anode material; calculating a voltage formed at the first cathode material circuit by calculating and adding an open-circuit voltage according to SOC of the first cathode material and an impedance voltage according to an impedance component of the first cathode material by using the current flowing through the first cathode material circuit; calculating a voltage formed at the second cathode material circuit by calculating and adding an open-circuit voltage according to SOC of the second cathode material and an impedance voltage according to an impedance component of the second cathode material by using the current flowing through the second cathode material circuit; calculating a voltage formed at the anode material circuit by calculating and adding an open-circuit voltage according to SOC of the anode material and an impedance voltage according to an impedance component of the anode material by using the current flowing through the anode material circuit; and estimating a voltage formed between the cathode and the anode by using the voltage formed at each circuit.

In addition, the method for estimating a voltage of a secondary battery according to the present disclosure may further include measuring an operation initiating voltage of the secondary battery after the secondary battery initiates charging or discharging; and setting initial values of SOC of the first cathode material, the second cathode material and the anode material by using the operation initiating voltage.

In addition, the method for estimating a voltage of a secondary battery according to the present disclosure may further include setting initial values of an impedance voltage according to the impedance component of the first cathode material, an impedance voltage according to the impedance component of the second cathode material and an impedance voltage according to the impedance component of the anode material into 0 (zero).

In addition, in the method for estimating a voltage of a secondary battery according to the present disclosure, the SOC of the first cathode material, the second cathode material and the anode material may be respectively varied by integrating currents flowing through the first cathode material circuit, the second cathode material circuit and the anode material circuit.

In addition, in the method for estimating a voltage of a secondary battery according to the present disclosure, an impedance voltage according to the impedance component of the first cathode material, an impedance voltage according to the impedance component of the second cathode material and an impedance voltage according to the impedance component of the anode material may be respectively calculated by using an impedance voltage calculation equation derived from a connection relation and an electrical characteristic value of a circuit element constituting each impedance component.

In addition, the method for estimating a voltage of a secondary battery according to the present disclosure may further include storing the estimated voltage of the secondary battery, outputting the estimated voltage of the secondary battery, or controlling charging or discharging of the secondary battery by using the estimated voltage of the secondary battery.

Meanwhile, the technical spirit of the present disclosure may be similarly applied to a case in which the cathode has a single cathode material and the anode has two or more anode materials.

For example, the anode of the secondary battery may include first and second anode materials having different operating voltage ranges, and the first anode material may be activated at a lower voltage range (or, at a low level of SOC) than the second anode material. In other words, if the secondary battery has a low voltage, operating ions may be mainly intercalated into the first anode material, while if the secondary battery has a high voltage, operating ions may be mainly intercalated into the second anode material. In this case, if the SOC of a secondary battery in a charge mode starts increasing from 0%, operating ions are mainly intercalated into the first anode material. In addition, if the capacity of the first anode material to which operating ions may be intercalated is mostly used, operating ions start being intercalated into the second anode material.

The circuit model described above may be easily changed by those skilled in the art by considering that blended anode materials are included in the anode of the secondary battery and a single cathode material is included in the cathode of the secondary battery. In other words, the circuit model used for deriving the voltage estimating model may be replaced with a circuit model including an anode material circuit having a first anode material circuit and a second anode material circuit as well as a cathode material circuit, and the current flowing through each circuit and the voltage formed at a circuit element included in each circuit may be reinterpreted in light of charging the secondary battery, as obvious to those skilled in the art.

In addition, the technical spirit of the present disclosure may also be similarly applied to a case in which blended cathode materials and blended anode materials are respectively included in the cathode and the anode of the secondary battery. In this case, the circuit model may be replaced with a circuit model including an anode material circuit having a first anode material circuit and a second anode material circuit and a cathode material circuit having a first cathode material circuit and a second cathode material circuit, and the current flowing through each circuit and the voltage formed at a circuit element included in each circuit may be reinterpreted in light of charging or discharging the secondary battery, as obvious to those skilled in the art.

Advantageous Effects

According to an aspect of the present disclosure, it is possible to commercially use a blended cathode material in a voltage range where charge/discharge control is not easily implemented due to a distinct voltage behavior.

According to another aspect of the present disclosure, it is possible to reliably estimate a voltage of a secondary battery in a voltage range where a distinct voltage behavior occurs. Therefore, cathode materials, which were not capable of being blended due to the distinct voltage behavior, may be blended into various combinations. In addition, by selecting two or more cathode materials among various kinds of available cathode materials and blending them into various combinations according to the purpose of a secondary battery, it is possible to provide a blended cathode material most appropriately optimized for the purpose of the secondary battery.

According to another aspect of the present disclosure, the distinct voltage behavior becomes a factor which does not allow various adjustment of a blending ratio of the blended cathode material. However, since the distinct voltage behavior may be reliably interpreted, a mixture ratio of cathode materials included in the blended cathode material may be adjusted in various ways according to the purpose of the secondary battery.

According to another aspect of the present disclosure, since various cathode materials may be blended with various compositions and at various ratios according to the purpose of a secondary battery, it is possible to dynamically deal with the diversification of cathode material or requirements of the technical fields of electric vehicles or power storage devices that are recently in the limelight.

DESCRIPTION OF DRAWINGS

The accompanying drawing illustrates a preferred embodiment of the present disclosure and together with the foregoing disclosure, serves to provide further understanding of the technical spirit of the present disclosure. However, the present disclosure is not construed as being limited to the drawing.

BEST MODE

Figure 1:
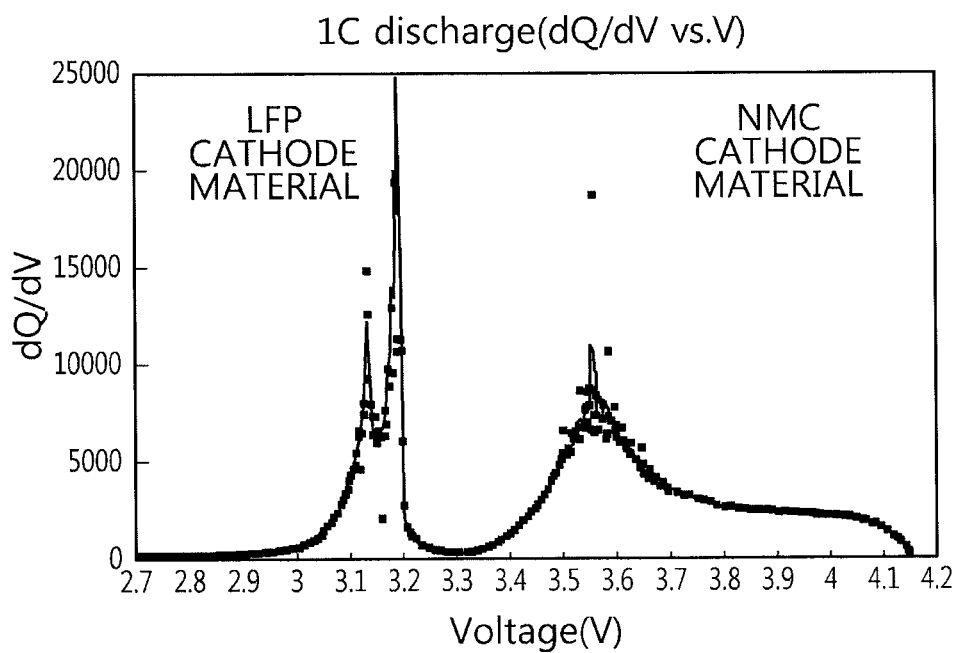
FIG. 1 is a graph showing dQ/dV distribution of a lithium secondary battery having $Li[Ni_{1/3}Mn_{1/3}Co_{1/3}]O_2$ (NMC) cathode material and $LiFePO_4$ (LFP)

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below are based on cases where the present disclosure is applied to a lithium secondary battery. Here, the lithium secondary battery is a general name of a secondary battery where lithium ions serve as operating ions during charge and discharge to cause electrochemical reactions at a cathode and an anode. The operating ions mean ions participating in electrochemical oxidizing and reducing reactions while the secondary battery operates (is charged or discharged), and may be for example lithium. Therefore, even though secondary batteries are called differently according to the kind of electrolyte or separator used in the lithium secondary battery, the kind of package used for packing the secondary battery, or the internal or external structure of the lithium secondary battery, such secondary batteries should be interpreted as being included in the scope of the lithium secondary battery if lithium ions are used as operating ions.

In addition, the present disclosure may also be applied to kinds of secondary batteries other than the lithium secondary batteries. Therefore, all kinds of secondary batteries should be interpreted as being included in the scope of the present disclosure if the spirit of the present disclosure may be applied even though their operating ion is not a lithium ion.

Moreover, the secondary battery is not limited to the number of its components. Therefore, the secondary battery should be interpreted as including a unit cell having an anode, an electrolyte and a cathode as a basic unit, an assembly of unit cells, a module having a plurality of assemblies connected in series in/or in parallel, a pack having a plurality of modules connected in series in/or in parallel, a battery system having a plurality of packs connected in series in/or in parallel, or the like.

In this embodiment, the cathode of the secondary battery whose voltage is estimated includes a blended cathode material. The blended cathode material includes at least a first cathode material and a second cathode material, and the concentration of operating ions reacting with the first cathode material and the concentration of operating ions reacting with the second cathode material are different from each other according to the change of voltage of the secondary battery. In other words, the first cathode material and the second cathode material have operating voltage ranges different from each other. The operating ions mean ions performing an electrochemical reaction with the first and second cathode materials when a secondary battery having the blended cathode material is being charged or discharged. The operating ions may vary depending on the kind of the secondary battery. For example, the operating ions may be lithium ions in the case the secondary battery is a lithium secondary battery.

The reaction means an electrochemical reaction including oxidation and reduction reactions of the first and second cathode materials accompanied with the operation of the secondary battery and may vary according to an operating mechanism of the secondary battery.

In an embodiment, the electrochemical reaction may mean that operating ions are intercalated into or deintercalated from the first cathode material and/or the second cathode material. In this case, the concentration of operating ions intercalated into the first and second cathode materials or the concentration of operating ions deintercalated from the first and second cathode materials may vary according to the change of voltage of the secondary battery.

For example, under the condition where the secondary battery is discharged, at a certain voltage range, operating ions may be preferentially intercalated into the first cathode material rather than the second cathode material, and at another voltage range, it may be the opposite.

As another example, under the condition where the secondary battery is charged, at a certain voltage range, operating ions may be preferentially deintercalated from the second cathode material rather than the first cathode material, and at another voltage range, it may be the opposite.

In an embodiment, in order to satisfy the condition that the concentrations of operating ions reacting with the first and second cathode materials are different from each other, the first and second cathode materials may satisfy at least one of the following conditions.

For example, when dQ/dV distribution of the first and second cathode materials is measured, locations and/or intensities of main peaks exhibited in the dQ/dV distribution of the cathode materials may be different from each other.

Here, the dQ/dV distribution means capacity characteristics of the cathode material in accordance with voltages. Locations of the main peaks of the dQ/dV distribution may vary according to the kind of the first and second cathode materials.

FIG. 1 is a graph showing measurement results of dQ/dV distribution, obtained by applying 1 c-rate discharge condition to a lithium secondary battery having a blended cathode material where $Li[Ni_{1/3}Mn_{1/3}Co_{1/3}]O_2$ (hereinafter, an NMC cathode material) and $LiFePO_4$ (hereinafter, an LFP cathode material) are blended at a ratio of 7:3 (weight ratio).

Referring to FIG. 1, a left peak corresponds to a main peak of the LFP cathode material and a right peak corresponds to a main peak of the NMC cathode material. It may be found that the main peak of the LFP cathode material and the main peak of the NMC cathode material have different locations and/or different intensities from each other. In addition, profiles around the main peak of the LFP cathode material are generated as lithium ions react with the LFP cathode material, and profiles around the main peak of the NMC cathode material are generated as lithium ions react with the NMC cathode material. Therefore, in a low voltage range, the LFP cathode material mainly reacts with lithium ions, and in a high voltage range, the NMC cathode material mainly reacts with lithium ions. This dQ/dV measurement results clearly support that the NMC cathode material and the LFP cathode material have different operating voltage ranges since the concentration of operating ions reacting with the NMC cathode material and the LFP cathode material varies according to the change of voltage.

In another embodiment, if the concentration of operating ions reacting with the first and second cathode materials varies according to the voltage of the secondary battery, when measuring a discharge resistance of the secondary battery containing the blended cathode material at various SOCs, the discharge resistance profile has a convex pattern (so-called, a protruding shape) or the discharge resistance profile may have two inflection points before and after the peak of the convex pattern.

Figure 2:
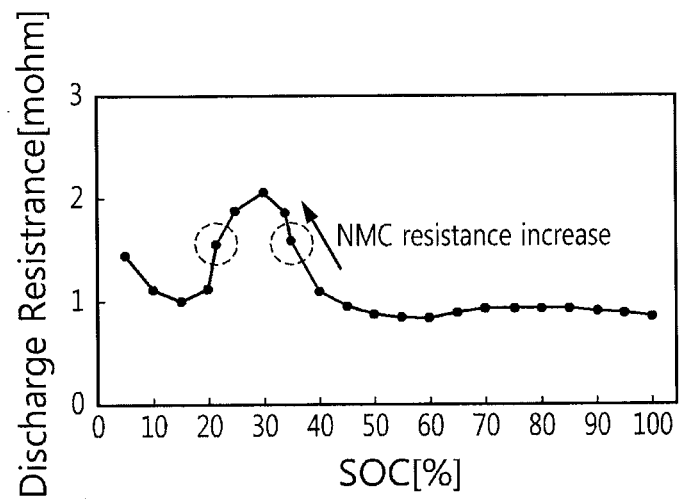
FIG. 2 is a graph showing a discharge resistance profile of a lithium secondary battery having an NMC cathode material and an LFP cathode material.

FIG. 2 is a discharge resistance profile showing measurement results of a discharge resistance according to the change of SOC with respect to a lithium secondary battery including a blended cathode material where an NMC cathode material and an LFP cathode material are blended at a ratio of 7:3 (weight ratio) in the cathode and a carbon-based material in the anode.

Referring to FIG. 2, it may be understood that the discharge resistance profile of the lithium secondary battery including the blended cathode material has a convex pattern when SOC is about 20 to 40%. In addition, it may also be understood that two inflection points (marked by a dotted circle) occur when SOC is in the range of 20 to 30% and in the range of 30 to 40%, respectively, in the discharge resistance profile. It has already been described with reference to FIG. 2 that the concentration of operating ions reacting with the NMC cathode material and the LFP cathode material varies according to the change of voltage. Therefore, when the discharge resistance profile of the lithium secondary battery has a convex pattern or when the discharge resistance profile has two inflection points before and after the peak of the convex pattern, the concentration of operating ions reacting with the first and second cathode materials varies according to the change of voltage, which makes the first and second cathode materials have different operating voltage ranges.

As another embodiment, if the concentration of operating ions reacting with the first and second cathode materials varies according to the voltage of the secondary battery, when the secondary battery containing the blended cathode material is charged or discharged, the charge or discharge voltage profile may have at least one voltage plateau. Here, the voltage plateau means a voltage range where an inflection point is present and a curvature of the voltage profile changes before and after the inflection point. In the voltage profile, in the SOC range in which the curvature is changing, a voltage change is relatively small.

Figure 3:
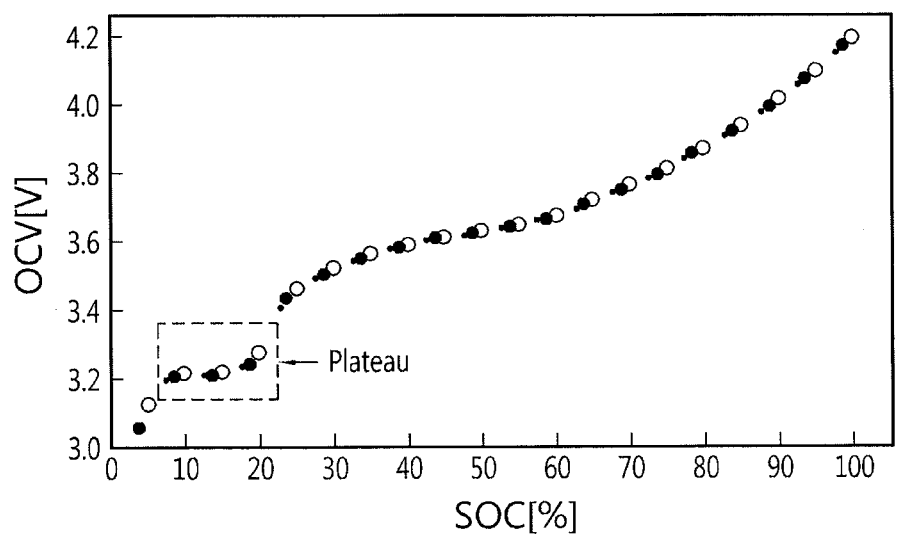
FIG. 3 is a graph showing a discharge voltage profile of a lithium secondary battery having an NMC cathode material and an LFP cathode material.

FIG. 3 is a discharge profile showing measurement results of an open-circuit voltage at various SOCs, obtained while discharging a lithium secondary battery including the blended cathode material where an NMC cathode material and an LFP cathode material are blended at a ratio of 7:3 (weight ratio) in the cathode and a carbon-based material in the anode.

Referring to FIG. 3, it may be understood that the discharge voltage profile of the lithium secondary battery including the blended cathode material has a voltage plateau when the open-circuit voltage is about 3.2V. In addition, this voltage plateau may also be identified when measuring an open-circuit voltage at various SOCs while charging the lithium secondary battery including the blended cathode material where an NMC cathode material and an LFP cathode material are blended at a ratio of 7:3 (weight ratio). The concentration of operating ions reacting with the NMC cathode material and the LFP cathode material varies according to a voltage change as described above with reference to FIG. 2. Therefore, it is obvious that when a charge or discharge voltage profile of a lithium secondary battery containing the first and second cathode materials has at least one voltage plateau, the concentration of operating ions reacting with the first and second cathode materials varies according to a voltage change of the lithium secondary battery and therefore the operating voltage ranges of the first and second cathode materials are different from each other.

Meanwhile, a voltage plateau having an inflection point is generated in the voltage profile depicted in FIG. 3 since the kind of cathode material mainly reacting with the operating ions varies according to a voltage range or an SOC range of a lithium secondary battery. For example, if the blended cathode material contains an NMC cathode material and an LFP cathode material, in a low voltage range (lower than about 3.2V), the LFP cathode material mainly reacts with the operating ions, and in a high voltage range (higher than about 3.2V), the NMC cathode material mainly reacts with the operating ions. However, since the NMC cathode material and the LFP cathode material have different reaction kinetics with respect to the operating ions, if the kind of cathode material mainly reacting with the operating ions is changed, dominant reaction kinetics is also changed. Therefore, if a voltage change pattern during charging or discharging of the secondary battery containing the blended cathode material is analyzed, an inflection point is observed on the voltage profile as shown in FIG. 3. In a range where an inflection point is present, the voltage varies greatly even though SOC of the secondary battery changes a little. Therefore, in a voltage range where dominant reaction kinetics of the blended cathode material is changed (near 3.2V), it is difficult to accurately measure a voltage of the secondary battery. However, if the circuit model described in the present disclosure is used, a voltage may be accurately estimated even though the secondary battery exhibits a voltage change pattern having an inflection point.

In another embodiment, when at least one of the first and second cathode materials has a voltage profile including a voltage plateau, the concentration of operating ions reacting with the first and second cathode materials may vary according to the voltage of the secondary battery.

Figure 4:
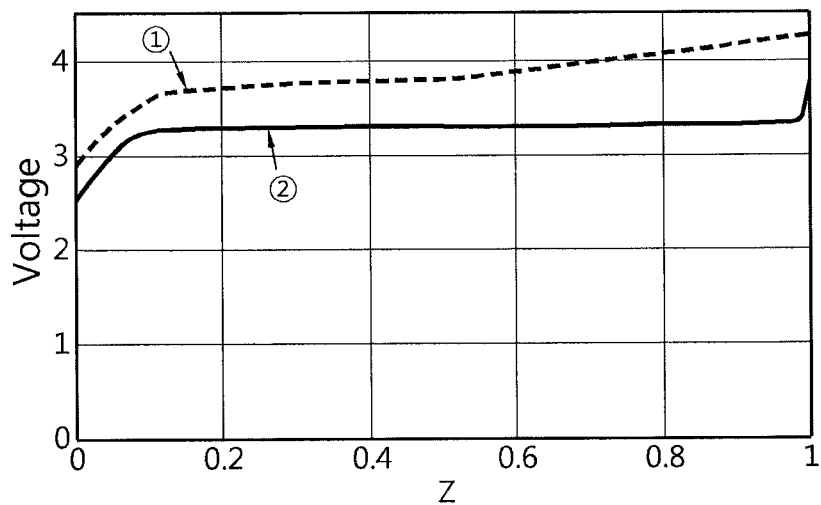
FIG. 4 is a graph showing measurement results of voltage profiles according to SOC of a half cell manufactured so that an NMC cathode material and a lithium metal are respectively used as a cathode and an anode and a half cell manufactured so that an LFP cathode material and a lithium metal are respectively used as a cathode and an anode.

FIG. 4 is a graph showing measurement results of voltage profiles at each SOC with respect to a half cell manufactured so that an NMC cathode material and a lithium metal are respectively used as a cathode and an anode and a half cell manufactured so that an LFP cathode material and a lithium metal are respectively used as a cathode and an anode.

In FIG. 4, graph ① depicts a voltage profile of the half cell including the NMC cathode material and graph ② depicts a voltage profile of the half cell including the LFP cathode material.

Referring to FIG. 4, a voltage plateau is observed in the voltage profile including the LFP cathode material. These measurement results supports that the concentration of operating ions reacting with the first and second cathode materials varies according to the voltage of the secondary battery when at least one of the first and second cathode materials has a voltage profile including a voltage plateau.

In the present disclosure, the first and second cathode materials may use any material without limitation. Therefore, any combination of cathode materials satisfying at least one of the above conditions may be considered as the first and second cathode materials, in addition to the NMC cathode material and the LFP cathode material, as obvious to those skilled in the art.

In an embodiment, the first cathode material may be an alkali metal compound expressed by a general chemical formula $A[A_xM_y]O_{2+z}$, wherein A includes at least one of Li, Na and K; M includes at least one element selected from the group consisting of Ni, Co, Mn, Ca, Mg, Al, Ti, Si, Fe, Mo, V, Zr, Zn, Cu, Al, Mo, Sc, Zr, Ru and Cr; $x \geq 0$; $1 \leq x+y \leq 2$; $-0.1 \leq z \leq 2$; and x, y, z and stoichiometric coefficients of the components included in M are selected so that the alkali metal compound maintains electrical neutrality.

Alternatively, the first cathode material may be an alkali metal compound expressed by $xLiM^1O_2\text{-}(1\text{-}x)Li_2M^2O_3$ wherein $M^1$ includes at least one element with an average oxidation state of +3; $M^2$ includes at least one element with an average oxidation state of +4; and $0 \leq x \leq 1$, and selectively coated with a carbon layer, an oxide layer and a fluoride layer, which is disclosed in U.S. Pat. No. 6,677,082, U.S. Pat. No. 6,680,143 or the like.

In another embodiment, the second cathode material may be lithium metal phosphate expressed by a general chemical formula $Li_aM^1{}_xFe_{1-x}M^2{}_yP_{1-y}M^3{}_zO_{4-z}$, wherein $M^1$ includes at least one element selected from the group consisting of Ti, Si, Mn, Co, Fe, V, Cr, Mo, Ni, Nd, Mg and Al; $M^2$ includes at least one element selected from the group consisting of Ti, Si, Mn, Co, Fe, V, Cr, Mo, Ni, Nd, Al, Mg, Al, As, Sb, Si, Ge, V and S; $M^3$ includes at least one element selected from a halogen group containing F; $0<a\leq2$, $0\leq x\leq1$, $0\leq y<1$, $0\leq z<1$; and a, x, y, z, and stoichiometric coefficients of the components included in $M^1{}_x$, $M^2{}_y$, and $M^3{}_z$ are selected so that the lithium metal phosphate maintains electrical neutrality, or $Li_3M_2(PO_4)_3$ wherein M includes at least one element selected from the group consisting of Ti, Si, Mn, Fe, Co, V, Cr, Mo, Ni, Mg and Al.

In another embodiment, the first cathode material may be an alkali metal compound expressed by $Li[Li_aNi_bCo_cMn_d]O_{2+z}$ ($a\geq0$; $a+b+c+d=1$; at least one of b, c and d is not zero; $-0.1\leq z\leq2$). In addition, the second cathode material may be at least one selected from the group consisting of $LiFePO_4$, $LiMn_xFe_yPO_4$ ($0<x+y\leq1$) and $Li_3Fe_2(PO_4)_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, Fe, V, Cr, Mo, Ni, Nd, Al, Mg, As, Sb, Si, Ge, V and S.

In the present disclosure, a blending ratio of the first and second cathode materials may be suitably adjusted according to an electrochemical design condition considering the use of a secondary battery to be manufactured.

In an embodiment, if a secondary battery having a good discharge power is desired, a cathode material having a good reactivity with operating ions may be selected as one of the first and second cathode materials, and a mixture ratio of the corresponding cathode material may be set to be as high as possible. For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 9:1.

In another embodiment, if a secondary battery having excellent high-temperature stability is desired, a cathode material having excellent high-temperature stability may be selected as one of the first and second cathode materials, and a mixture ratio of the corresponding cathode material may be set to be as high as possible. For example, $Li[Ni_{1/3}Mn_{1/3}CO_{1/3}]O_2$ and $LiFePO_4$ may be respectively selected as the first cathode material and the second cathode material, and a mixture ratio of the first cathode material and the second cathode material may be set to be 2:8.

In another embodiment, if a secondary battery having a low production cost is desired, a cathode material having a low price may be selected as one of the first and second cathode materials, and a mixture ratio of the corresponding cathode material may be set to be as high as possible. For example, $Li[Ni_{1/3}Mn_{1/3}CO_{1/3}]O_2$ and $LiFePO_4$ may be respectively selected as the first cathode material and the second cathode material, and a mixture ratio of the first cathode material and the second cathode material may be set to be 1:9.

In another embodiment, if a secondary battery having a good discharge power and excellent high-temperature stability is desired, a cathode material having a good reactivity with operating ions and a cathode material having excellent high-temperature stability may be respectively selected as the first and second cathode materials, and a mixture ratio of the cathode materials may be set in consideration of balancing of the discharge power and the high-temperature stability. For example, $Li[Ni_{1/3}Mn_{1/3}CO_{1/3}]O_2$ and $LiFePO_4$ may be respectively selected as the first cathode material and the second cathode material, and a mixture ratio of the first cathode material and the second cathode material may be set to be 4:6.

In another embodiment, if a secondary battery having a great capacity per weight is desired, a cathode material having a great capacity per weight may be selected as one of the first and second cathode materials, and a mixture ratio of the corresponding cathode material may be set to be as high as possible. For example, $Li[Ni_{0.5}Mn_{0.3}Co_{0.2}]O_2$ and $LiFePO_4$ may be respectively selected as the first cathode material and the second cathode material, and a mixture ratio of the first cathode material and the second cathode material may be set to be 9:1.

The selection of the first and second cathode materials and the adjustment of their mixture ratio described above are just examples. Therefore, it is obvious to those skilled in the art that the first and second cathode materials may be suitably selected and a mixture ratio of the cathode materials may be suitably set according to a design condition of a secondary battery.

In addition, the number of kinds of cathode materials included in the blended cathode material is not limited to two. In addition, for enhancing properties of the blended cathode material, other additives such as a conducting agent, a binder or the like may be added to the blended cathode material without special limitation.

In an embodiment, the blended cathode material may include three kinds of cathode materials different from each other, for example a blended cathode material including $LiMn_2O_4$, $Li[Li_aNi_xCo_yMn_z]O_2$ [a≥0; a+x+y+z=1; at least one of x, y and z is not zero] and $LiFePO_4$.

In another embodiment, the blended cathode material may have four kinds of cathode materials different from each other, for example a blended cathode material including $LiNiO_2$, $LiMn_2O_4$, $Li[Li_aNi_xCo_yMn_z]O_2$ [a≥0; a+x+y+z=1; at least one of x, y and z is not zero] and $LiFePO_4$.

The secondary battery containing the blended cathode material may be loaded on various kinds of electric-driven apparatuses which operate with electric energy, and the kind of the electric-driven apparatus is not specially limited.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy in the power grid, or an uninterrupted power supply device for supplying power to various information communication devices such as server computers and mobile communication devices in times of emergency such as a blackout.

Figure 5:
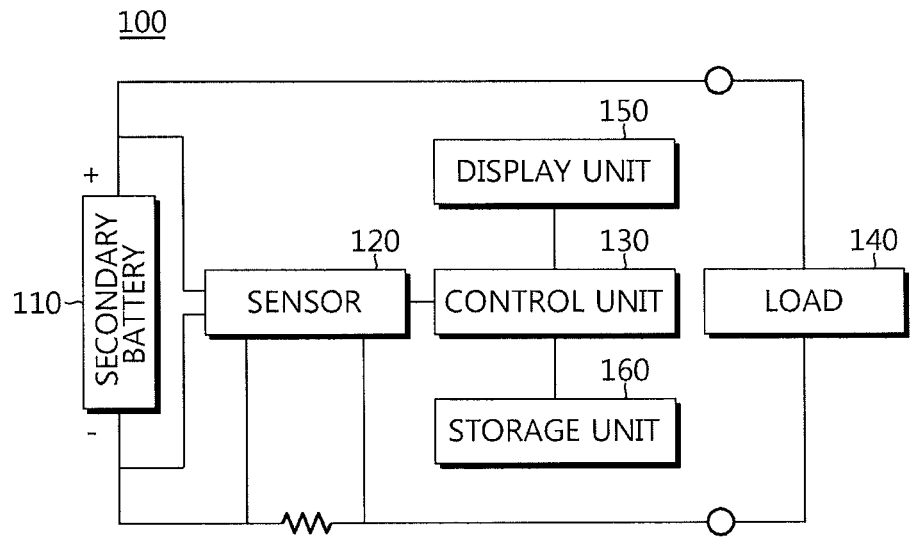
FIG. 5 is a block diagram showing an apparatus for estimating a voltage according to an embodiment of the present disclosure.

FIG. 5 is a block diagram schematically showing an apparatus 100 for estimating a voltage of a secondary battery containing a blended cathode material.

As shown in FIG. 5, the voltage estimating apparatus 100 includes a sensor 120 and a control unit 130 and is connected to a secondary battery 110 containing a blended cathode material to estimate a voltage of the secondary battery 110.

The voltage estimating apparatus 100 is electrically connected to a load 140. The load 140 may be included in various kinds of electric-driven apparatuses and means an energy-consuming device included in an electric-driven apparatus operated with the electric energy supplied when the secondary battery 110 is discharged. The load may be a rotation-driving device such as a motor, a power-converting device such as an inverter, or the like, but the present disclosure is not limited to specific kinds of loads.

The voltage estimating apparatus 100 may further include a storage unit 160, selectively. The storage unit 160 is not specially limited if it may serve as a storage medium capable of recording and erasing information. For example, the storage unit 160 may be RAM, ROM, register, hard disk, optical recording medium or magnetic recording medium. The storage unit 160 may be connected to the control unit 130 so as to be accessed by the control unit 130 through, for example, a data bus or the like. The storage unit 160 store and/or update and/or erase and/or transmit program having various control logics executed by the control unit 130 and/or data generated when the control logics are executed. The storage unit 160 may be divided into two or more logic units and may also be included in the control unit 130, without any restriction.

The voltage estimating apparatus 100 may further include a display unit 150, selectively. The display unit 150 is not specially limited if it may display information generated by the control unit 130 as a graphic interface. For example, the display unit 150 may be a liquid crystal display, an LED display, an OLED display, an E-INK display, a flexible display or the like. The display unit 150 may be connected to the control unit 130 directly or indirectly. When indirect connection is adopted, the display unit 150 may be located in an area physically separated from the area where the control unit 130 is located. In addition, a third control unit (not shown) may be interposed between the display unit 150 and the control unit 130 to receive information, which will be displayed on the display unit 150 by the third control unit, from the control unit 130 and display the information on display unit 150. For this, the third control unit and the control unit 130 may be connected through a communication line.

The sensor 120 measures an operation initiating voltage of the secondary battery 110 after the secondary battery 110 initiates operation (charging or discharging), repeatedly measures a current of the secondary battery 110 at time intervals while the secondary battery 110 is operating, and provides the measured operation initiating voltage and the measured current of the secondary battery 110 to the control unit 130.

If necessary, the sensor 120 measures a voltage of the secondary battery 110 repeatedly at time intervals while the secondary battery 110 is operating, and provides the measured voltage of the secondary battery 110 to the control unit 130.

The control unit 130 is a component capable of executing at least one control logic required for estimating a voltage of the secondary battery 110 and may estimate a voltage of the secondary battery 110 by using a circuit model predefined as a software algorithm, without being limited thereto.

The circuit model is a mathematical model for estimating a voltage of the secondary battery while the secondary battery is operating and may be expressed as a generalized function as shown in Equation (1) below.

$$V_{cell}[k] = V_{cathode}[k] - V_{anode}[k] \quad (1)$$

In Equation (1), $V_{cell}[k]$ represents a voltage of the secondary battery 110 estimated by using the circuit model, $V_{cathode}[k]$ represents an estimated voltage formed at the cathode of the secondary battery 110, and $V_{anode}[k]$ represents an estimated voltage formed at the anode of the secondary battery 110. In addition, k represents a time index corresponding to the time when the voltage of the secondary battery 110 is estimated. Hereinafter, unless otherwise noted, terms endowed with k in parentheses represent terms estimated or calculated at $k^{th}$ times.

In an embodiment, $V_{cathode}[k]$ and $V_{anode}[k]$ may be expressed as generalized functions as shown in Equations (2) and (3) below.

$$V_{cathode}[k] = f(V_{c1}[k], V_{c2}[k], i_{cell}[k], \ldots) \quad (2)$$

$$V_{anode}[k] = g(V_a[k], i_{cell}[k], \ldots) \quad (3)$$

Here, $V_{c1}[k]$, $V_{c2}[k]$ and $V_a[k]$ may be generalized as shown in Equations (4), (5) and (6), without being limited thereto.

$$V_{c1}[k] = OCV_{c1}(z_{c1}[k]) + V_{impedance\_c1}[k] \quad (4)$$

$$V_{c2}[k] = OCV_{c2}(z_{c2}[k]) + V_{impedance\_c2}[k] \quad (5)$$

$$V_a[k] = OCV_a(z_a[k]) + V_{impedance\_a}[k] \quad (6)$$

In Equation (2), the function 'f' represents a function for calculating a voltage formed at the cathode of the secondary battery 110, and in Equation (3), the function 'g' represents a function for calculating a voltage formed at the anode of the secondary battery 110. These functions 'f' and 'g' may be derived by using a circuit model as an embodiment, as being described later in detail.

In the equations shown in Equations (2) to (6), the subscripts 'c1' and 'c2' respectively represent the first cathode material and the second cathode material included in the blended cathode material, and the subscript 'a' represents the anode material included in the anode. In addition, the subscripts 'impedance_c1' and 'impedance_c2' respectively represent impedance components including a resistance element, a capacity element, an inductor element or their combinations, respectively originating from the first cathode material and the second cathode material, and the impedance_a represents impedance components including a resistance element, a capacity element, an inductor element or their combinations, originating from the anode material.

Referring to Equation (2), the function 'f' used for calculating the voltage $V_{cathode}[k]$ formed at the cathode includes at least $V_{c1}[k]$, $V_{c2}[k]$ and $i_{cell}[k]$ as input parameters. In addition, the function 'g' used for calculating the voltage $V_{anode}[k]$ formed at the anode includes at least $V_a[k]$ and $i_{cell}[k]$ as input parameters. The symbol '...' included in the functions 'f' and 'g' shows that other parameters may be added as input parameters when necessary.

In the functions 'f' and 'g', $i_{cell}[k]$ is a common parameter and represents a current flowing through the secondary battery 110. The $i_{cell}[k]$ may be measured repeatedly at time intervals by the sensor 120. When the secondary battery 110 is discharged, the $i_{cell}[k]$ corresponds to a discharge current and has a positive value. In addition, if the secondary battery 110 is charged, the $i_{cell}[k]$ corresponds to a charge current and has a negative value.

The functions 'f' and 'g' include various parameters in addition to $i_{cell}[k]$. Hereinafter, the various parameters of each of the functions 'f' and 'g' will be taken into consideration.

<Input Parameters of the Function 'f'>

In the function 'f', $V_{c1}[k]$ is a voltage formed at the first cathode material as a result of reaction of the first cathode material and operating ions and is expressed as a sum of at least $OCV_{c1}(z_{c1}[k])$ and $V_{impedance\_c1}[k]$.

$OCV_{c1}(z_{c1}[k])$ is an open-circuit voltage formed at the first cathode material and is a function varying according to $z_{c1}[k]$ which represents SOC of the first cathode material. Since $z_{c1}[k]$ decreases from 1 to 0 as operating ions react with the first cathode material, $OCV_{c1}(z_{c1}[k])$ tends to decrease as $z_{c1}[k]$ decreases, or vice versa. $OCV_{c1}(z_{c1}[k])$ may be defined in advance by making a half cell with the first cathode material and measuring an open-circuit voltage profile of the half cell while discharging the half cell until SOC (namely, $z_{c1}[k]$) changes from 1 to 0.

$OCV_{c1}(z_{c1}[k])$ may be a look-up table built by storing an open-circuit voltage corresponding to each $z_{c1}[k]$ on the open-circuit voltage profile as a table-type database, or a look-up function obtained by numerically analyzing the open-circuit voltage profile as a function of $z_{c1}[k]$, without being limited thereto.

$z_{c1}[k]$ is a parameter in inverse proportion to a ratio of the capacity of operating ions intercalated into the first cathode material with respect to an entire capacity $Q_{c1}$ of the first cathode material where operating ions may be intercalated. Therefore, if the operating ions start being intercalated, $z_{c1}[k]$ decreases from 1 and becomes 0 if all operating ions corresponding to the entire capacity $Q_1$ are intercalated. In other words, $z_{c1}[k]$ is a parameter relating to the amount of operating ions having reacted with the first cathode material and may correspond to SOC of the half cell of the first cathode material mentioned above. Therefore, $z_{c1}[k]$ may be regarded as a parameter representing SOC of the first cathode material.

$V_{impedance\_c1}[k]$ represents a voltage formed by an impedance component including a resistance element, a capacity element, an inductor element or their combinations, originating from electrical characteristics of the first cathode material. The impedance component may be changed according to the kind of the first cathode material, and if there is no impedance in view of the electrochemical characteristics of the first cathode material, it is not excluded that $V_{impedance\_c1}[k]$ becomes 0. In addition, at least two circuit elements included in the impedance component may be connected in series and/or in parallel. In addition, $V_{impedance\_c1}[k]$ is changed with the influence of current generated when the first cathode material reacts with operating ions. Therefore, $V_{impedance\_c1}[k]$ may be calculated by using an impedance voltage calculation equation derived from a connection relation and an electrical characteristic value of a circuit element constituting the impedance component.

In addition, in the function 'f', $V_{c2}[k]$ is a voltage formed at the second cathode material as a result of reaction between the second cathode material and operating ions and is expressed as a sum of at least $OCV_{c2}(z_{c2}[k])$ and $V_{impedance\_c2}[k]$.

$OCV_{c2}(z_{c2}[k])$ is an open-circuit voltage component formed at the second cathode material and is a function varying according to $z_{c2}[k]$ which represents SOC of the second cathode material. Since $z_{c2}[k]$ decreases from 1 to 0 as operating ions react with the second cathode material, $OCV_{c2}(z_{c2}[k])$ tends to decrease as $z_{c2}[k]$ decreases, or vice versa.

$OCV_{c2}(z_{c2}[k])$ may be defined in advance by making a half cell with the second cathode material and measuring an open-circuit voltage profile of the half cell while discharging the half cell until SOC (namely, $z_{c2}[k]$) changes from 1 to 0.

$OCV_{c2}(z_{c2}[k])$ may be a look-up table built by storing an open-circuit voltage corresponding to each $z_{c2}[k]$ on the open-circuit voltage profile as a table-type database, or a look-up function obtained by numerically analyzing the open-circuit voltage profile as a function of $z_{c2}[k]$, without being limited thereto.

$z_{c2}[k]$ is a parameter in inverse proportion to a ratio of the capacity of operating ions intercalated into the second cathode material with respect to an entire capacity $Q_{c2}$ of the second cathode material where operating ions may be intercalated. Therefore, if the operating ions start being intercalated into the second cathode material, $z_{c2}[k]$ decreases from 1 and becomes 0 if all operating ions corresponding to the entire capacity $Q_2$ are intercalated. In other words, $z_{c2}[k]$ is a parameter relating to the amount of operating ions having reacted with the second cathode material and may correspond to SOC of the half cell of the second cathode material mentioned above. Therefore, $z_{c1}[k]$ may be regarded as a parameter representing SOC of the second cathode material.

$V_{impedance\_c2}[k]$ represents a voltage formed by an impedance component including a resistance element, a capacity element, an inductor element or their combinations, originating from electrical characteristics of the second cathode material. The impedance component may be changed according to the kind of the second cathode material, and if there is no impedance in view of the electrochemical characteristics of the second cathode material, it is not excluded that $V_{impedance\_c2}[k]$ becomes 0. In addition, at least two circuit elements included in the impedance component may be connected in series and/or in parallel. In addition, $V_{impedance\_c2}[k]$ is changed with the influence of current generated when the second cathode material reacts with operating ions. Therefore, $V_{impedance\_c2}[k]$ may be calculated by using an impedance voltage calculation equation derived from a connection relation and an electrical characteristic value of a circuit element constituting the impedance component.

<Input Parameters of the Function 'g'>

In the function 'g', $V_a[k]$ is a voltage formed at the anode material as a result of the reaction of the anode material and operating ions and is expressed as a sum of at least $OCV_a(z_a[k])$ and $V_{impedance\_a}[k]$.

$OCV_a(z_a[k])$ represents an open-circuit voltage of the anode material and is a function varying according to $z_a[k]$ which represents SOC of the anode material. $z_a[k]$ decreases as SOC of the anode material decreases, namely operating ions are deintercalated from the anode material. For reference, in view of the anode material, the decrease of SOC means that operating ions are deintercalated from the anode material. Therefore, $OCV_a(z_a[k])$ tends to increase as $z_a[k]$ decreases, or vice versa. $OCV_a(z_a[k])$ may be defined by using an open-circuit voltage profile obtained by making a half cell with the anode material and measuring an open-circuit voltage obtained by performing a discharge experiment until SOC (namely, $z_a[k]$) is changed from 1 to 0.

$OCV_a(z_a[k])$ may be a look-up table built by storing an open-circuit voltage corresponding to each $z_a[k]$ on the open-circuit voltage profile as a table-type database, or a look-up function obtained by numerically analyzing the open-circuit voltage profile as a function of $z_a[k]$, without being limited thereto.

When an entire capacity of the anode material where operating ions may be deintercalated is $Q_a$, if the operating ions start being deintercalated, $z_a[k]$ decreases from 1 in inverse proportion to a ratio of the capacity of deintercalated operating ions in comparison to $Q_a$ and becomes 0 if all operating ions corresponding to the entire capacity $Q_a$ are deintercalated, or vice versa. Therefore, $z_a[k]$ is a parameter relating to the amount of operating ions deintercalated from the anode material and may correspond to SOC of the half cell of the anode material mentioned above. In addition, since the ratio of operating ions deintercalated from the anode material is identical to SOC of the secondary battery, $z_a[k]$ may correspond to $z_{cell}[k]$ which represents SOC of the secondary battery.

$V_{impedance\_a}[k]$ represents a voltage formed by an impedance component including a resistance element, a capacity element, an inductor element or their combinations, originating from electrical characteristics of the anode material. The impedance component may be changed according to the kind of the anode material, and if there is no impedance in view of the electrochemical characteristics of the anode material, it is not excluded that $V_{impedance\_a}[k]$ becomes 0. In addition, at least two circuit elements included in the impedance component may be connected in series and/or in parallel. In addition, $V_{impedance\_a}[k]$ is changed with the influence of current generated when the anode material reacts with operating ions. Therefore, $V_{impedance\_a}[k]$ may be calculated by using an impedance voltage calculation equation derived from a connection relation and an electrical characteristic value of a circuit element constituting the impedance component.

From the above equations, $V_{cell}[k]$, $V_{c1}[k]$, $V_{c2}[k]$ and $V_a[k]$ may be arranged again as shown in Equations (7), (8), (9) and (10) below.

$$V_{cell}[k]=f(V_{c1}[k],V_{c2}[k],i_{cell}[k],\ldots)-g(V_a[k],I_{cell}[k],\ldots) \qquad (7)$$

$$V_{c1}[k]=OCV_{c1}(z_{c1}[k])+V_{impedance\_c1}[k] \qquad (8)$$

$$V_{c2}[k]=OCV_{c2}(z_{c2}[k])+V_{impedance\_c2}[k] \qquad (9)$$

$$V_a[k]=OCV_a(z_a[k])+V_{impedance\_a}[k] \qquad (10)$$

Hereinafter, a circuit model according to an embodiment of the present disclosure will be described in detail. However, the circuit model may be modified when necessary according to the kinds of blended cathode material and anode material included in the secondary battery. Therefore, even though the circuit model is modified according to the change of the blended cathode material, the modified circuit model should be interpreted as being included in the scope of the circuit model disclosed in the present disclosure.

Figure 6:
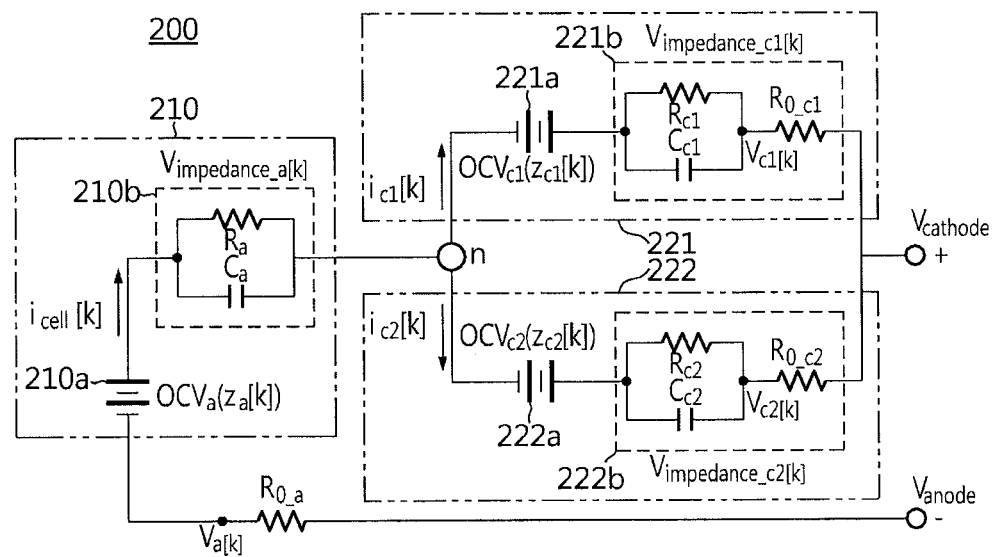
FIG. 6 is a circuit diagram showing a circuit model according to an embodiment of the present disclosure.

FIG. 6 is a circuit diagram exemplarily showing a circuit model 200 according to an embodiment of the present disclosure.

Referring to FIG. 6, the circuit model 200 includes a first cathode material circuit 221 and a second cathode material circuit 222 connected in parallel, and an anode material circuit 210 connected to the first and second cathode material circuits 221, 222 in series.

The anode circuit 210 includes an open-circuit voltage component 210a of the anode material and an impedance component 210b relating to electrochemical characteristics of the anode material. When the secondary battery is charged or discharged, voltages respectively corresponding to $OCV_a(z_a[k])$ and $V_{impedance\_a}[k]$ are generated at both terminals of the open-circuit voltage component 210a and the impedance component 210b of the anode material. Therefore, the anode material circuit 210 may be regarded as being modeled so that the voltage formed at the anode material circuit 210 varies by the impedance component and $z_a[k]$ which represents SOC of the anode material. Here, $z_a[k]$ represents the amount of operating ions intercalated into or deintercalated from the anode material. $OCV_a(z_a[k])$ and $V_{impedance\_a}[k]$ have been described above with reference to Equation (10).

In an embodiment, the impedance component 210b of the anode material includes an RC circuit having a resistance element $R_a$ and a capacity element $C_a$ connected in parallel, and a resistance element $R_{0\_a}$ connected to the RC circuit in series. The resistance elements $R_a$ and $R_{0\_a}$ and the capacity elements $C_a$ included in the impedance component 210b of the anode material are determined by experiments considering electrochemical properties of at least an anode material and electrical properties of a metallic current collector included in the anode. In addition, the resistance element and/or capacity element included in the impedance component 210b of the anode material may be omitted. In addition, the impedance component 210b of the anode material may further include another resistance element, another capacity element, another inductor element, or combinations thereof. $V_{impedance\_a}[k]$ representing a voltage formed at the impedance component 210b may be calculated from a connection relation and an electrical characteristic value of a circuit element constituting the impedance component 210b. Here, the electrical characteristic value may be any one of a resistance value, a capacitance value and an inductance value.

The first cathode material circuit 221 includes an open-circuit voltage component 221a corresponding to the first cathode material and an impedance component 221b of the first cathode material. When the secondary battery is charged or discharged, voltages corresponding to $OCV_{c1}(z_{c1}[k])$ and $V_{impedance\_c1}[k]$ are respectively generated at both terminals of the open-circuit voltage component 221a and the impedance component 221b of the first cathode material. Therefore, the first cathode material circuit 221 may be regarded as being modeled so that the voltage formed at the first cathode material circuit 221 varies by the impedance component and $z_{c1}[k]$ which represents SOC of the first cathode material. Here, $z_{c1}[k]$ represents the amount of operating ions intercalated into or deintercalated from the first cathode material. $OCV_{c1}(z_{c1}[k])$ and $V_{impedance\_c1}[k]$ have been described above with reference to Equation (8).

In an embodiment, the impedance component 221b of the first cathode material includes an RC circuit having a resistance element $R_{c1}$ and a capacity element $C_{c1}$ connected in parallel, and a resistance element $R_{0\_c1}$ connected to the RC circuit in series. The resistance elements $R_{c1}$ and $R_{0\_c1}$ and the capacity element $C_{c1}$ included in the impedance component 221b of the first cathode material are determined by experiments considering electrochemical characteristics of at least a first cathode material and electrical properties of a metallic current collector included in the cathode. In addition, the resistance element and/or capacity element included in the impedance component 221b of the first cathode material may be omitted. In addition, the impedance component 221b of the first cathode material may further include another resistance element, another capacity element, another inductor element, or combinations thereof. $V_{impedance\_c1}[k]$ representing a voltage formed at the impedance component 221b may be calculated from a connection relation and an electrical characteristic value of a circuit element constituting the impedance component 221b. Here, the electrical characteristic value may be any one of a resistance value, a capacitance value and an inductance value.

The second cathode material circuit 222 includes an open-circuit voltage component 222a and an impedance component 222b corresponding to the second cathode material. When the secondary battery is charged or discharged, voltages respectively corresponding to $OCV_{c2}(z_{c2}[k])$ and $V_{impedance\_c2}[k]$ are generated at both terminals of the open-circuit voltage component 222a and the impedance component 222b of the second cathode material. Therefore, the second cathode material circuit 222 may be regarded as being modeled so that the voltage formed at the second cathode material circuit 222 varies by the impedance component and $z_{c2}[k]$ which represents SOC of the second cathode material. Here, $z_{c2}[k]$ represents the amount of operating ions intercalated into or deintercalated from the second cathode material. $OCV_{c2}(z_{c2}[k])$ and $V_{impedance\_c2}[k]$ have been described above with reference to Equation (9).

In an embodiment, the impedance component 222b of the second cathode material includes an RC circuit having a resistance element $R_{c2}$ and a capacity element $C_{c2}$ connected in parallel, and a resistance element $R_{0\_c2}$ connected to the RC circuit in series. The resistance elements $R_{c2}$ and $R_{0\_c2}$ and the capacity element $C_{c2}$ included in the impedance component 222b of the second cathode material are determined by experiments considering electrochemical characteristics of at least a second cathode material and electrical properties of a metallic current collector included in the cathode. In addition, the resistance element and/or capacity element included in the impedance component 222b of the second cathode material may be omitted. In addition, the impedance component 222b of the second cathode material may further include another resistance element, another capacity element, another inductor element, or combinations thereof. $V_{impedance\_c2}[k]$ representing a voltage formed at the impedance component 222b may be calculated from a connection relation and an electrical characteristic value of a circuit element constituting the impedance component 222b. Here, the electrical characteristic value may be any one of a resistance value, a capacitance value and an inductance value.

When the secondary battery is charged or discharged, the movement of operating ions is caused in the secondary battery, and the movement of operating ions may be expressed by a current flow $i_{cell}$, $i_{c1}$, $i_{c2}$ at the circuit model 200.

When the secondary battery is discharged, operating ions are deintercalated from the anode material and move toward the blended cathode material. At this time, a part of the operating ions moving from the anode to the cathode is moved toward the first cathode material and the other is moved to the second cathode material. If this flow of the operating ions is applied to the circuit model 200, it may be considered that a part of the current flowing from the anode to the cathode becomes a current $i_{c1}$ flowing toward the first cathode material and the other current becomes $i_{c2}$ flowing toward the second cathode material. This current division is shown at a parallel circuit. Therefore, in the circuit model 200, the first cathode material circuit 221 and the second cathode material circuit 222 are connected in parallel. However, the electrical connection between the first cathode material circuit and the second cathode material circuit may be modified in various ways according to the kind of cathode materials of the blended cathode material and an operating mechanism of the secondary battery, as obvious in the art.

Meanwhile, when the secondary battery is charged, operating ions are deintercalated from the blended cathode material and move toward the anode material. At this time, the operating ions deintercalated from the first cathode material and the second cathode material join together and move toward the anode material, and the directions of the currents $i_{c1}$, $i_{c2}$, and $i_{cell}$ are reversed as shown in the figures. This joined current flow is shown at a parallel circuit, similar to the divided current flow. Therefore, while the secondary battery is being charged, the circuit model 200 in which the first cathode material circuit 221 and the second cathode material circuit 222 are connected in parallel is still effective.

The entire current generated by the movement of operating ions between the anode material and the blended cathode material correspond to $i_{cell}[k]$ which represents a current flowing when the secondary battery is charged or discharged. Therefore, a current equation may be induced based on the node n shown in the circuit model, like Equation (11) below.

$$-i_{cell}[k] = i_{c1}[k] + i_{c2}[k] \quad (11)$$

In Equation (11) when the secondary battery is being charged, $i_{cell}[k]$ has a negative value and $i_{c1}[k]$ and $i_{c2}[k]$ have positive values. On the contrary, when the secondary battery is being discharged, $i_{cell}[k]$ has a positive value and $i_{c1}[k]$ and $i_{c2}[k]$ have negative values.

Meanwhile, when a voltage difference of both terminals of the resistance component $R_{0\_c1}$ is defined as $V_{R0\_c1}[k]$ and a voltage difference of both terminals of the resistance component $R_{0\_c2}$ is defined as $V_{R0\_c2}[k]$, due to the Ohm's low, $i_{c1}[k]$ and $i_{c2}[k]$ of Equation (11) may be arranged as shown in Equations (12) and (13) below $$i_{c1}[k] = \frac{V_{R0\_c1}[k]}{R_{0\_c1}} \quad (12)$$

$$i_{c2}[k] = \frac{V_{R0\_c2}[k]}{R_{0\_c2}} \quad (13)$$

In addition, if voltages applied to left terminals of the resistance components $R_{0\_c1}$ and $R_{0\_c2}$ are respectively defined as $V^*_{c1}[k]$ and $V^*_{c2}[k]$ and a voltage of the cathode is defined as $V_{cathode}[k]$, $V_{R0\_c1}[k]$ and $V_{R0\_c2}[k]$ of Equations (12) and (13) may be respectively arranged like Equations (14) and (15) below.

$$V_{R0\_c1}[k] = V_{cathode}[k] - V^*_{c1}[k] \quad (14)$$

$$V_{R0\_c1}[k] = V_{cathode}[k] - V^*_{c2}[k] \quad (15)$$

If Equations (12), (13), (14) and (15) are applied to Equation (11), Equation (11) may be arranged like Equation (16) below.

$$-i_{cell}[k] = i_{c1}[k] + i_{c2}[k] \quad (16)$$
$$= \frac{V_{cathode}[k] - V^*_{c1}[k]}{R_{0\_c1}} + \frac{V_{cathode}[k] - V^*_{c2}[k]}{R_{0\_c2}}$$
$$V_{cathode}\left(\frac{1}{R_{0\_c1}} + \frac{1}{R_{0\_c2}}\right) = \frac{V^*_{c1}[k]}{R_{0\_c1}} + \frac{V^*_{c2}[k]}{R_{0\_c2}} - i_{cell}[k]$$
$$V_{cathode} = \left(\frac{R_{0\_c1} R_{0\_c2}}{R_{0\_c1} + R_{0\_c2}}\right)\left(\frac{V^*_{c1}[k]}{R_{0\_c1}} + \frac{V^*_{c2}[k]}{R_{0\_c2}} - i_{cell}[k]\right)$$

In addition, if Equations (14), (15) and (16) are applied to Equations (12) and (13), Equations (12) and (13) may be arranged like Equations (17) and (18) below.

$$i_{c1}[k] = \frac{V_{cathode}[k] - V^*_{c1}[k]}{R_{0\_c1}} \quad (17)$$

$$i_{c1}[k] = \frac{V^*_{c2}[k] - V^*_{c1}[k] - i_{cell}[k] R_{0\_c2}}{R_{0\_c1} + R_{0\_c2}}$$

$$i_{c2}[k] = \frac{V_{cathode}[k] - V^*_{c2}[k]}{R_{0\_c2}} \quad (18)$$

$$i_{c2}[k] = \frac{V^*_{c1}[k] - V^*_{c2}[k] - i_{cell}[k] R_{0\_c1}}{R_{0\_c1} + R_{0\_c2}}$$

Meanwhile, if considering the node n connecting the first and second cathode materials circuits 221, 222 as a reference potential, $V^*_{c1}[k]$ and $V^*_{c2}[k]$ may be expressed like Equations (19) and (20) below.

$$V^*_{c1}[k] = OCV_{c1}(z_{c1}[k]) + V_{RC\_c1}[k] \quad (19)$$

$$V^*_{c2}[k] = OCV_{c2}(z_{c2}[k]) + V_{RC\_c2}[k] \quad (20)$$

In Equation (19), $OCV_{c1}(z_{c1}[k])$ is a voltage formed by the open-circuit voltage component 221a of the first cathode material, and $V_{RC\_c1}[k]$ is a voltage formed by the RC circuit included in the impedance component 221b of the first cathode material. Similarly, in Equation (20), $OCV_{c2}(z_{c2}[k])$ is a voltage formed by the open-circuit voltage component 222a of the second cathode material, and $V_{RC\_c2}[k]$ is a voltage formed by the RC circuit included in the impedance component 222b of the second cathode material.

By using Equations (19) and (20), Equations (16), (17) and (18) may be arranged like Equations (21), (22) and (23) below.

$$V_{cathode}[k] = \left(\frac{R_{0\_c1} R_{0\_c2}}{R_{0\_c1} + R_{0\_c2}}\right)\left(\frac{OCV_{c1}(z_{c1}[k]) + V_{RC\_c1}[k]}{R_{0\_c1}} + \frac{OCV_{c2}(z_{c2}[k]) + V_{RC\_c2}[k]}{R_{0\_c2}} - i_{cell}[k]\right) \quad (21)$$

$$i_{c1}[k] = \frac{(OCV_{c2}(z_{c2}[k]) + V_{RC\_c2}[k]) - (OCV_{c1}(z_{c1}[k]) + V_{RC\_c1}[k]) - i_{cell}[k] R_{0\_c2}}{R_{0\_c1} + R_{0\_c2}} \quad (22)$$

$$i_{c2}[k] = \frac{(OCV_{c1}(z_{c1}[k]) + V_{RC\_c1}[k]) - (OCV_{c2}(z_{c2}[k]) + V_{RC\_c2}[k]) - i_{cell}[k] R_{0\_c1}}{R_{0\_c1} + R_{0\_c2}} \quad (23)$$

In Equations (21), (22) and (23), $V_{RC\_c1}[k]$ and $V_{RC\_c2}[k]$ are voltages respectively formed by the RC circuits of the first and second cathode material circuits 221, 222. Generally, voltage and current of the RC circuit satisfy Differential Equation (24) below as time t changes. Therefore, if Equation (24) is changed into a discrete time equation, Equation (25) below may be obtained, where Δt represents a current and voltage measurement interval.

$$\dot{V}(t) = -\frac{1}{RC} V(t) + \frac{1}{C} i(t) \quad (24)$$

$$V[k+1] = V[k] e^{-\frac{\Delta t}{RC}} + R(1 - e^{-\frac{\Delta t}{RC}}) i[k] \quad (25)$$

If Equation (25) corresponding to an RC circuit equation is used, the voltages $V_{RC\_c1}[k]$ and $V_{RC\_c2}[k]$ respectively formed by RC circuits of the first and second cathode materials circuits 221, 222 may be expressed with a discrete time equation like Equations (26) and (27) below.

$$V_{RC\_c1}[k+1] = V_{RC\_c1}[k]e^{-\frac{\Delta t}{R_{c1}C_{c1}}} + R_{c1}\left(1 - e^{-\frac{\Delta t}{R_{c1}C_{c1}}}\right)i_{c1}[k] \quad (26)$$

$$V_{RC\_c2}[k+1] = V_{RC\_c2}[k]e^{-\frac{\Delta t}{R_{c2}C_{c2}}} + R_{c2}\left(1 - e^{-\frac{\Delta t}{R_{c2}C_{c2}}}\right)i_{c2}[k] \quad (27)$$

Equation (26) is a voltage calculation equation for calculating a voltage formed by the RC circuit among impedance components included in the first cathode material circuit 221. The impedance of the first cathode material circuit 221 further includes a resistance $R_{0\_c1}$. Therefore, the impedance voltage calculation equation for calculating a voltage formed by the impedance of the first cathode material circuit 221 may be induced by adding voltage $R_{0\_c1} \cdot i_{c1}[k]$ formed by resistance $R_{0\_c1}$ to Equation (26).

In addition, Equation (27) is a voltage calculation equation for calculating a voltage formed by the RC circuit among impedance components included in the second cathode material circuit 222. The impedance of the second cathode material circuit 222 further includes a resistance $R_{0\_c2}$. Therefore, the impedance voltage calculation equation for calculating a voltage formed by the impedance of the second cathode material circuit 222 may be induced by adding voltage $R_{0\_c2} \cdot i_{c2}[k]$ formed by resistance $R_{0\_c2}$ to Equation (27).

Meanwhile, referring to Equation (21), the voltage $V_{cathode}[k]$ of the cathode is determined by four variables, namely voltages $OCV_{c1}(z_{c1}[k])$ and $OCV_{c2}(z_{c2}[k])$ formed by the open-circuit voltage component of the first and second cathode materials circuits 221, 222 and voltages $V_{RC\_c1}[k]$ and $V_{RC\_c2}[k]$ formed by the RC circuit.

Among the four voltages, $OCV_{c1}(z_{c1}[k])$ and $OCV_{c2}(z_{c2}[k])$ corresponding to $z_{c1}[k]$ and $z_{c2}[k]$ may be defined in advance as a look-up table or a look-up function as described above. Therefore, $OCV_{c1}(z_{c1}[k])$ and $OCV_{c2}(z_{c2}[k])$ may be calculated instantly if $z_{c1}[k]$ and $z_{c2}[k]$ are known.

The $z_{c1}[k]$ and $z_{c2}[k]$ are changed according to $i_{c1}[k]$ and $i_{c2}[k]$ which are currents respectively flowing to the first and second cathode materials during $\Delta t$. Therefore, discrete time equations relating to the $z_{c1}[k]$ and $z_{c2}[k]$ may be expressed like Equations (28) and (29) below by means of an Ampere counting method.

$$z_{c1}[k+1] = z_{c1}[k] + i_{c1}[k]\Delta t / Q_{c1} \quad (28)$$

$$z_{c2}[k+1] = z_{c2}[k] + i_{c2}[k]\Delta t / Q_{c2} \quad (29)$$

In the above, in order to calculate the voltage $V_{cathode}[k]$ of the cathode by using Equations (26), (27), (28) and (29) which are four discrete time equations induced as above, it is required to initialize $V_{RC\_c1}[0]$, $V_{RC\_c2}[0]$, $z_{c1}[0]$, $z_{c2}[0]$, $i_{c1}[0]$, $i_{c2}[0]$ to specific values when k is 0 (zero). However, referring to Equations (22) and (23), since $i_{c1}[0]$ and $i_{c2}[0]$ are eventually determined by $V_{RC\_c1}[0]$, $V_{RC\_c2}[0]$, $z_{c1}[0]$ and $z_{c2}[0]$, the values to be initialized are reduced to $V_{RC\_c1}[0]$, $V_{RC\_c2}[0]$, $z_{c1}[0]$ and $z_{c2}[0]$.

Among the values required to be initialized, $V_{RC\_c1}[0]$ and $V_{RC\_c2}[0]$ are voltages formed by the RC circuits included in the first and second cathode materials circuits 221, 222. However, in the RC circuit, voltage changes slowly even though current flows through the RC circuit. In addition, the voltage formed by the RC circuit is small just after the secondary battery initiates charging or discharging. Therefore, in an embodiment, the $V_{RC\_c1}[0]$ and $V_{RC\_c2}[0]$ may be set to have initial condition values of 0 (zero) as shown in Equations (30) and (31) below. Of course, $V_{RC\_c1}[0]$ and $V_{RC\_c2}[0]$ may be set to have values greater than 0 (zero) depending on the kinds of the blended cathode material included in the secondary battery.

$$V_{RC\_c1}[0] = 0 \quad (30)$$

$$V_{RC\_c2}[0] = 0 \quad (31)$$

As described above, if $V_{RC\_c1}[0]$ and $V_{RC\_c2}[0]$ are initialized, $V_{impedance\_c1}[k]$ and $V_{impedance\_c2}[k]$ may be respectively initialized to $R_{0\_c1}[0]$ and $R_{0\_c2}*i_{c2}[0]$.

In addition, $z_{c1}[0]$ and $z_{c2}[0]$ represent SOC of the first and second cathode materials where operating ions may be intercalated, when it starts to estimate a voltage of the secondary battery. Therefore, $z_{c1}[0]$ and $z_{c2}[0]$ may be initialized to values of $OCV^{-1}_{c1}(OCV_{c1}[0])$ and $OCV^{-1}_{c2}(OCV_{c2}[0])$. Here, $OCV^{-1}_{c1}$ and $OCV^{-1}_{c1}$ are inverse transformation operators of $OCV_{c1}$ and $OCV_{c2}$ which correspond to an inversely transformed look-up table or an inversely transformed look-up function of $OCV_{c1}(z_{c1}[k])$ and $OCV_{c2}(z_{c2}[k])$, which may be defined in advance as a look-up table or a look-up function. Therefore, the $OCV^{-1}_{c1}$ and $OCV^{-1}_{c2}$ may be regarded as operators for calculating states $z_{c1}[0]$ and $z_{c2}[0]$ of the first and second cathode materials, which may respectively correspond to voltages $OCV_{c1}[0]$ and $OCV_{c2}[0]$ formed at the open-circuit voltage components of the first and second cathode materials circuits.

Meanwhile, $OCV_{c1}[0]$ and $OCV_{c2}[0]$ may be respectively open-circuit voltages formed by the first cathode material and the second cathode material when it starts to estimate a voltage of the secondary battery, and may be approximately set like Equations (32) and (33) below by using the operation initiating voltage $V_{cell}[0]$ of the secondary battery, measured just after it starts to estimate a voltage of the secondary battery. However, Equations (32) and (33) may be modified when necessary according to the kinds of the blended cathode material included in the secondary battery and the operating mechanism of the secondary battery.

Supposing $K_{cell}[0] \cong OCV_{c1}(z_{c1}[0]) - OCV_a(z_a[0])$
$OCV_{c1}(z_{c1}[0]) \cong V_{cell}[0]$, $z_a[0] = z_{cell}[0]$, $OCV_{c1}[0]$
$\cong V_{cell}[0] + OCV_a(z_{cell}[0])$ (32)

Supposing $V_{cell}[0] \cong OCV_{c2}(z_{c2}[0]) - OCV_a(z_a[0])$
$OCV_{c2}(z_{c2}[0]) \cong V_{cell}[0]$, $z_a[0] = z_{cell}[0]$, $OCV_{c2}[0]$
$\cong K_{cell}[0] + OCV_a(z_{cell}[0])$ (33)

In Equations (32) and (33), $z_{cell}[0]$ may be calculated by using inversely transformed $OCV^{-1}_{cell}$ of $OCV_{cell}$ corresponding to a look-up table or a look-up function where an open-circuit voltage of the secondary battery is defined according to SOC of the secondary battery. In other words, $z_{cell}[0]$ is $OCV^{-1}_{cell}(V_{cell}[0])$. The look-up table or the look-up function of $OCV_{cell}$ may be easily obtained through an open-circuit voltage measurement experiment for each SOC of the secondary battery including the blended cathode material. In addition, $OCV_a$ is a look-up table or a look-up function for calculating a voltage formed at the open-circuit voltage component of the anode material circuit 210 by using SOC of the anode material, namely a residual capacity of the anode material where operating ions may be deintercalated therefrom as an input parameter. This has been described in detail above with reference to Equation (10).

If Equations (32) and (33) are used, initial values of $z_{c1}$ and $z_{c2}$ may be set as in Equations (34) and (35) below.

$$z_{c1}[0] = OCV^{-1}_{c1}(OCV_{c1}[0]) = OCV^{-1}_{c1}(V_{cell}[0] + OCV_a(OCV^{-1}_{cell}(V_{cell}[0]))) \quad (34)$$

$$z_{c2}[0] = OCV^{-1}_{c2}(OCV_{c2}[0]) = OCV^{-1}_{c2}(V_{cell}[0] + OCV_a(OCV^{-1}_{cell}(V_{cell}[0]))) \quad (35)$$

The circuit model described above is focused on estimation of a voltage formed at the cathode of the secondary battery including the blended cathode material. However, the above voltage estimating model may also be similarly applied when estimating a voltage formed at the anode of the secondary battery.

In other words, in the anode material circuit 210 of FIG. 6, when taking the node n as a reference potential, voltage $V^*_a[k]$ applied to the left terminal of the resistance $R_{0\_a}$ may be expressed as a sum of voltages formed at the open-circuit voltage component of the anode material circuit 210 and the RC circuit element as shown in Equation (36) below.

$$V^*_a[k] = OCV_a(z_a[k]) + V_{RC\_a}[k] \tag{36}$$

In addition, since the voltage $V_{anode}[k]$ of the anode is lower than $V^*_a[k]$ as much as $i_{cell}[k] \cdot R_{0\_a}$, $V_{anode}[k]$ may be expressed like Equation (37) below.

$$\begin{aligned} V_{anode}[k] &= V^*_a[k] - i_{cell}[k]R_{0\_a} \\ &= OCV_a(z_a[k]) + V_{RC\_a}[k] - i_{cell}[k]R_{0\_a} \end{aligned} \tag{37}$$

In addition, $z_a[k]$ representing SOC of the anode material and the voltage formed at the RC circuit of the anode material circuit 210 may be expressed as discrete time equations like Equations (38) and (39) below, similar to Equations (26) and (28).

$$z_a[k+1] = z_a[k] - i_a[k]\Delta t / Q_a = z_a[k] - i_{cell}[k]\Delta t / Q_a \tag{38}$$

$$\begin{aligned} V_{RC\_a}[k+1] &= V_{RC\_a}[k]e^{-\frac{\Delta t}{R_a C_a}} + R_a\left(1 - e^{-\frac{\Delta t}{R_a C_a}}\right)i_a[k] \\ &= V_{RC\_a}[k]e^{-\frac{\Delta t}{R_a C_a}} + R_a\left(1 - e^{-\frac{\Delta t}{R_a C_a}}\right)i_{cell}[k] \end{aligned} \tag{39}$$

Equation (39) is a voltage calculation equation formed by the RC circuit, among the impedance components included in the anode material circuit 210. The impedance of the anode material circuit 210 further includes resistance $R_{0\_a}$. Therefore, the impedance voltage calculation equation for calculating a voltage formed by the impedance component of the anode material circuit 210 may be induced by adding voltage $R_{0\_a} \cdot i_{cell}[k]$ formed by resistance $R_{0\_a}$ to Equation (39).

In addition, in order to use the discrete time equations (38) and (39), in an embodiment, initial conditions $V_{RC\_a}[0]$ and $z_a[0]$ may be set as in Equations (40) and (41).

$$V_{RC\_a}[0] = 0 \tag{40}$$

$$z_a[0] = z_{cell}[0] = OCV^{-1}_{cell}(V_{cell}[0]) \tag{41}$$

In Equations (40) and (41), the initial condition of $V_{RC\_a}[0]$ is set to be 0 (zero) because voltage at the RC circuit slowly changes according to the change of current just after the secondary battery initiates charging or discharging.

In addition, the initial condition of $z_a[0]$ is set to be identical to $z_{cell}[0]$ because SOC of the anode material is substantially identical to SOC of the secondary battery when the secondary battery initiates charging or discharging.

Meanwhile, if the $V_{RC\_a}[0]$ is initialized as in Equation (40), the voltage $V_{impedance\_a}[k]$ formed by the impedance component included in the anode material circuit 210 may be initialized to $R_{0\_a} \cdot i_{cell}[0]$. However, just after the secondary battery initiates charging or discharging, $i_{cell}[0]$ is 0 or near to 0. Therefore, the initial condition $V_{impedance\_a}[0]$ may be regarded as being 0 or near to 0.

Hereinafter, a method for the control unit 130 to estimate a voltage of the secondary battery whenever time $\Delta t$ passes just after the secondary battery initiates charging or discharging will be described in detail by using the circuit model described above.

Figure 7:
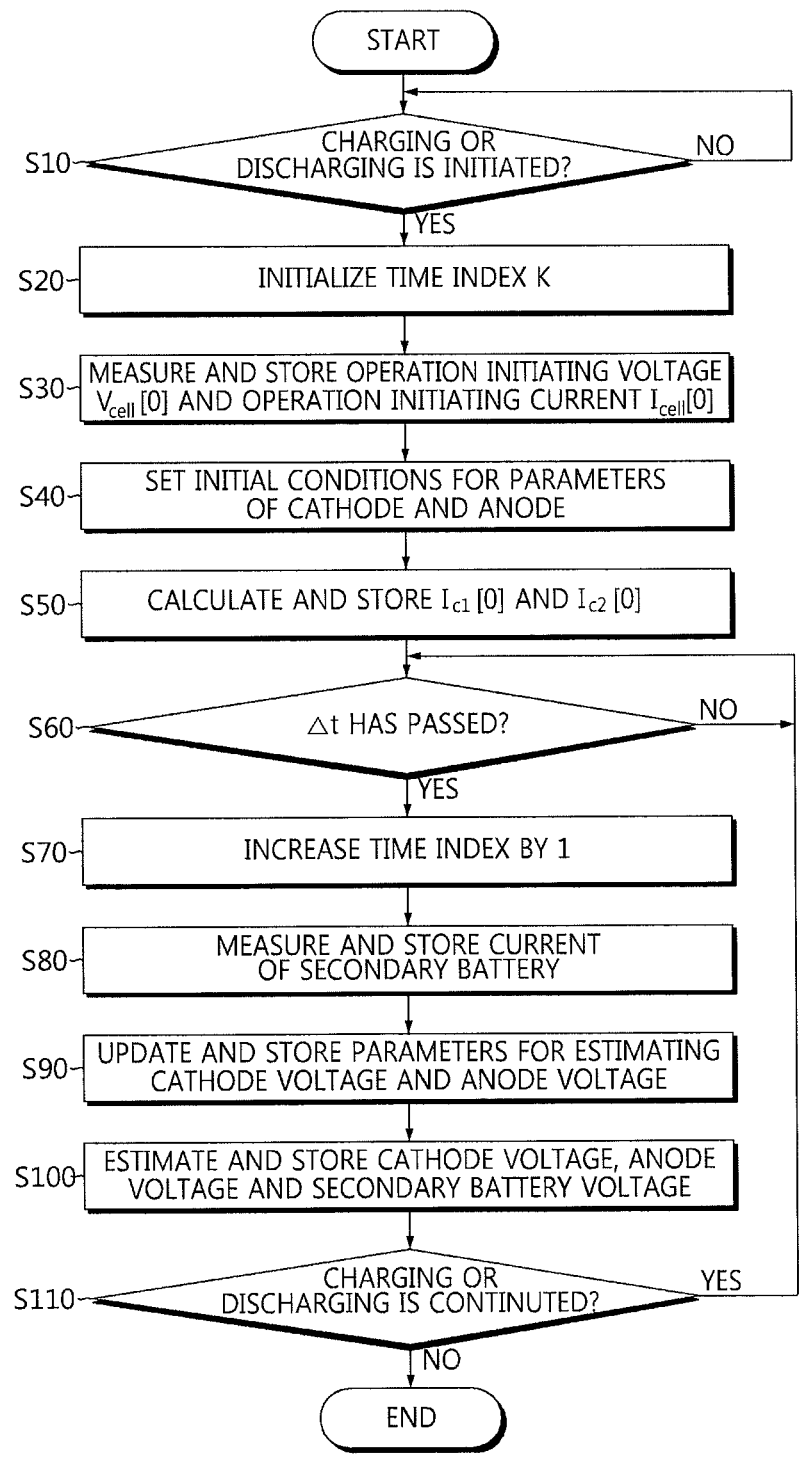
FIG. 7 is a flowchart for illustrating a method for estimating a state of a secondary battery according to an embodiment of the present disclosure.

FIG. 7 is a flowchart for illustrating a method for estimating a voltage of a secondary battery according to an embodiment of the present disclosure.

First, the control unit 130 monitors direction and magnitude of a current flowing through the secondary battery 110 by using the sensor 120 to determine whether the secondary battery initiates operation (charging or discharging) (S10).

If it is determined that the secondary battery 110 initiates operation, the control unit 130 initializes a time index k to 0 (S20). After that, the control unit 130 measures $V_{cell}[0]$ corresponding to an operation initiating voltage of the secondary battery 110 and $I_{cell}[0]$ corresponding to an operation initiating current thereof by means of the sensor 120 and stores them in the storage unit 160 (S30).

After measuring and storing $V_{cell}[0]$ and $I_{cell}[0]$, the control unit 130 initializes initial conditions for parameters of the cathode and the anode as follows (S40).

$$V_{RC\_c1}[0] = V_{RC\_c2}[0] = V_{RC\_a}[0] = 0$$

$$z_{c1}[0] = OCV^{-1}_{c1}(V_{cell}[0] + OCV_a(OCV^{-1}_{cell}(V_{cell}[0])))$$

$$z_{c2}[0] = OCV^{-1}_{c2}(V_{cell}[0] + OCV_a(OCV^{-1}_{cell}(V_{cell}[0])))$$

$$z_a[0] = z_{cell}[0] = OCV^{-1}_{cell}(V_{cell}[0])$$

After setting the initial conditions of the parameters, the control unit 130 calculates $i_{c1}[0]$ and $i_{c2}[0]$ by applying the initial conditions and the value of $i_{cell}[0]$ to Equations (22) and (23) relating to the cathode and stores them in the storage unit 160 (S50).

$$i_{c1}[0] = \frac{(OCV_{c2}(z_{c2}[0]) + V_{RC_{c2}}[0]) - (OCV_{c1}(z_{c1}[0]) + V_{RC_{c1}}[0]) - i_{cell}[0]R_{0_{c2}}}{R_{0_{c1}} + R_{0_{c2}}}$$

$$i_{c2}[0] = \frac{(OCV_{c1}(z_{c1}[0]) + V_{RC\_c1}[0]) - (OCV_{c2}(z_{c2}[0]) + V_{RC\_c2}[0]) - i_{cell}[0]R_{0\_c1}}{R_{0\_c1} + R_{0\_c2}}$$

After calculating and storing $i_{c1}[0]$ and $i_{c2}[0]$, the control unit 130 determines whether the time passes as much as $\Delta t$ (S60). Here, $\Delta t$ corresponds to an interval for estimating a voltage of the secondary battery.

If it is determined that the time has passed as much as $\Delta t$, the control unit 130 increases the time index k by 1 (S70). After that, the control unit 130 measures the current $I_{cell}[1]$ of the secondary battery by means of the sensor 120 and stores it in the storage unit 160 (S80).

If measuring and storing $I_{cell}[1]$ is completed, the control unit 130 updates parameters required for estimating the cathode voltage $V_{cathode}[1]$ and the anode voltage $V_{anode}[1]$ and stores them in the storage unit 160 (S90).

In other words, with regard to the cathode, the control unit 130 updates $V_{RC\_c1}[1]$, $V_{RC\_c2}[1]$, $z_{c1}[1]$ and $z_{c2}[1]$ by applying $V_{RC\_c1}[0]$, $V_{RC\_c2}[0]$, $i_{c1}[0]$ and $i_{c2}[0]$ to Equations (26), (27), (28) and (29), and with regard to the anode, the control unit 130 updates $V_{RC\_a}[1]$ and $z_a[1]$ by applying $V_{RC\_a}[0]$ and $i_{cell}[0]$ to Equations (39) and (38). After that, the control unit 130 stores the updated values in the storage unit 160.

$$V_{RC\_c1}[1] = V_{RC\_c1}[0]e^{-\frac{\Delta t}{R_{c1}C_{c1}}} + R_{c1}\left(1 - e^{-\frac{\Delta t}{R_{c1}C_{c1}}}\right)i_{c1}[0]$$

$$V_{RC\_c2}[1] = V_{RC\_c2}[0]e^{-\frac{\Delta t}{R_{c2}C_{c2}}} + R_{c2}\left(1 - e^{-\frac{\Delta t}{R_{c2}C_{c2}}}\right)i_{c2}[0]$$

$$z_{c1}[1] = z_{c1}[0] + i_{c1}[0]\Delta t/Q_{c1}$$

$$z_{c2}[1] = z_{c2}[0] + i_{c2}[0]\Delta t/Q_{c1}$$

$$V_{RC\_a}[1] = V_{RC\_a}[0]e^{-\frac{\Delta t}{R_a C_a}} + R_a\left(1 - e^{-\frac{\Delta t}{R_a C_a}}\right)i_{cell}[0]$$

$$z_a[1] = z_a[0] - i_{cell}[0]\Delta t/Q_a$$

Subsequently, the control unit 130 estimates voltages of the cathode and the anode by using the updated parameters and the current $i_{cell}[1]$ of the secondary battery measured by the sensor 110 when the time $\Delta t$ passes, and estimates a voltage of the secondary battery from the estimated voltages of the cathode and the anode.

In other words, the control unit 130 calculates $V_{cathode}[1]$, $i_{c1}[1]$ and $i_{c2}[1]$ by applying the updated parameters and $i_{cell}[1]$ to Equations (21), (22) and (23) relating to the cathode and stores them in the storage unit 160. In addition, the control unit 130 calculates $V_{anode}[1]$ by applying the updated parameters and $i_{cell}[1]$ to Equation (37) relating to the anode and stores it in the storage unit 160. After that, the control unit 130 estimates the voltage $V_{cell}[1]$ of the secondary battery when $\Delta t$ passes once (namely, k=1) by subtracting $V_{anode}[1]$ from $V_{cathode}[1]$ and stores the estimated voltage in the storage unit 160.

$$V_{cathode}[1] = \left(\frac{R_{0_{c1}}R_{0_{c2}}}{R_{0_{c1}} + R_{0_{c2}}}\right)$$

$$\left(\frac{OCV_{c1}(z_{c1}[1]) + V_{RC_{c1}}[1])}{R_{0_{c1}}} + \frac{OCV_{c2}(z_{c2}[1]) + V_{RC_{c2}}[1]}{R_{0_{c2}}} - i_{cell}[1]\right)$$

$$i_{c1}[1] = \frac{(OCV_{c2}(z_{c2}[1]) + V_{RC\_c2}[1]) - (OCV_{c1}(z_{c1}[1]) + V_{RC\_c1}[1]) - i_{cell}[1]R_{0\_c2}}{R_{0\_c1} + R_{0\_c2}}$$

$$i_{c2}[1] = \frac{(OCV_{c1}(z_{c1}[1]) + V_{RC\_c1}[1]) - (OCV_{c2}(z_{c2}[1]) + V_{RC\_c2}[1]) - i_{cell}[1]R_{0\_c1}}{R_{0\_c1} + R_{0\_c2}}$$

$$V_{anode}[1] = OCV_a(z_a[1]) + V_{RC\_a}[1] - i_{cell}[1]R_{0\_a}$$

$$V_{cell}[1] = V_{cathode}[1] - V_{anode}[1]$$

If the voltage $V_{cell}[1]$ of the secondary battery is estimated, the control unit 130 monitors direction and magnitude of a current flowing through the secondary battery by using the sensor 120 to determine whether the secondary battery continues charging or discharging (S110).

If it is determined that the secondary battery continues charging or discharging, the control unit 130 returns the process to Step S60 and then repeats the process of estimating a voltage of the secondary battery.

Therefore, whenever $\Delta t$ passes, the control unit 130 estimates $V_{cathode}[k]$ by updating $V_{RC\_c1}[k]$, $V_{RC\_c2}[k]$, $z_{c1}[k]$ and $z_{c2}[k]$ with respect to the cathode, estimates $V_{anode}[k]$ by updating $V_{RC\_a}[k]$ and $z_a[k]$ with respect to the anode, and then estimates a voltage of the secondary battery by subtracting $V_{anode}[k]$ from $V_{cathode}[k]$, repeatedly.

Though not shown in the figures, the control unit 130 may control charging or discharging of the secondary battery by using the voltage of the secondary battery estimated through the above process. In other words, if the estimated voltage of the secondary battery exceeds a preset critical range, the control unit 130 may interrupt charging or discharging of the secondary battery in order to prevent an overcharge or over-discharge. Further, the control unit 130 may quantitatively calculate SOC or capacity degradation state of a secondary battery by using the estimated voltage of the secondary battery. In addition, the control unit 130 may output the estimated voltage of the secondary battery to another control device. For example, in the case the secondary battery is loaded in an electric or hybrid vehicle, the control unit 130 may output the estimated voltage of the secondary battery to the central control unit of the vehicle. Moreover, the control unit 130 may output the estimated voltage of the secondary battery through the display unit 150. At this time, the display unit may output the estimated voltage of the secondary battery as a graphic interface such as a bar graph or numerals.

The control unit 130 may selectively include processors well known in the art, ASIC (application-specific integrated circuit), other chipsets, logic circuits, registers, communication modems, data processing devices or the like in order to execute various control logics described below. In addition, when the control logic is implemented as software, the control unit 130 may be implemented as an aggregate of program modules. At this time, program modules may be stored in a memory and executed by processors. The memory may be provided in or out of the processor and be connected to the processor by various units known in the art. In addition, the memory may be included in the storage unit 160 of the present disclosure. Moreover, the memory is a general name to call devices storing information, regardless of the kind of devices, without being limited to a specific memory device.

In addition, any combinations of various control logics of the control unit 130 may be composed in computer-readable program codes and recorded in a computer-readable recording medium. The recording medium is not specially limited if it may be accessed by a processor included in a computer. For example, the recording medium includes at least one selected from the group consisting of ROM, RAM, register, CD-ROM, magnetic tape, hard disk, floppy disk and optical data storage. The computer-readable codes may be modulated into carrier signals and included in a communication carrier at a specific time and also be distributed to, stored in and executed by computers connected by a network. The program codes for implementing the combined control logics may be easily inferred by programmers in the art.

In the present disclosure, the secondary battery may include a cathode containing a blended cathode material, an anode containing an anode material, and a separator.

In an embodiment, the cathode may include a thin-plate metallic current collector made of conductive material, and a cathode material coating layer containing the blended cathode material and formed on at least one surface of the metallic current collector.

The metallic current collector is made of material with chemical stability and high conductivity. For example, the metallic current collector may be made of aluminum, stainless steel, nickel, titanium, sintered carbon or the like. As another example, the metallic current collector may be made of aluminum or stainless steel coated with carbon, nickel, titanium, silver or the like on the surface thereof.

The cathode material coating layer may further include additives such as a conducting agent and a binder in addition to the blended cathode material.

The conducting agent is not specially limited if it may improve electric conductivity of the blended cathode material, and may use various conductive carbonaceous materials such as graphite, carbon black, acetylene black, Ketjen black, Super-P, carbon nano tube or the like, without being limited thereto.

The binder is not specially limited if it allows a close physical joint among particles of the blended cathode material and a close interfacial joint between the blended cathode material and the metallic current collector. Various kinds of polymers such as polyvinylidene fluoride-co-hexafluoropropylene polymer (PVDF-co-HFP), polyvinylidene fluoride, polyacrylonitrile, polymethyl methacrylate or the like may be used as the binder, without being limited thereto.

In an embodiment, the anode may include a thin-plate metallic current collector made of conductive material, and an anode material coating layer containing anode material and formed on at least one surface of the metallic current collector.

The metallic current collector is made of material with chemical stability and high conductivity. For example, the metallic current collector may be made of copper, aluminum, stainless steel, nickel, titanium, sintered carbon or the like. As another example, the metallic current collector may be made of copper or stainless steel coated with carbon, nickel, titanium, silver or the like on the surface thereof or an aluminum-cadmium alloy.

The anode material is not specially limited if it has a different oxidation/reduction potential (redox potential) from the blended cathode material and allows intercalation of operating ions during the charging process and deintercalation of operating ions during the discharging process.

The anode material may use carbonaceous material, lithium metal, silicon, tin or the like, without being limited thereto, and may also use metal oxides such as $TiO_2$ and $SnO_2$ with a potential lower than 2V. Preferably, the anode material may use carbonaceous material, and the carbonaceous material may use low crystalline carbon or high crystalline carbon. The low crystalline carbon representatively includes soft carbon or hard carbon, and the high crystalline carbon representatively includes high-temperature sintered carbon such as natural graphite, Kish graphite, pyrolytic carbon, mesophase pitch based carbon fiber, meso-carbon microbeads, mesophase pitches, petroleum derived cokes, or tar pitch derived cokes.

The anode material coating layer may further include additives such as a conducting agent and a binder in addition to the anode material. The conducting agent and the binder may use materials which are available as a conducting agent and a binder included in a cathode material coating layer.

The separator is not specially limited if it has a pore structure for electrically separating the cathode and the anode and allowing the transfer of operating ions.

In an embodiment, the separator may use a porous polymer film, for example a porous polymer film made from polyolefin-based polymer such as ethylene homopolymer, propylene homopolymer, ethylene/butene copolymer, ethylene/hexene copolymer, and ethylene/methacrylate copolymer, or their laminates. As other examples, a common porous non-woven fabric made from, for example, high-melting glass fibers or polyethylene terephthalate fibers may be used.

Meanwhile, at least one surface of the separator may include a coating layer of inorganic particles. In addition, the separator may be made of a coating layer of inorganic particles. The particles of the coating layer may have a structure coupled with a binder so that interstitial volumes are present among adjacent particles. This structure is disclosed in PCT International Publication WO 2006/025662, which may be incorporated herein by reference. The inorganic particles may be made of inorganic material with a dielectric constant of 5 or above. The inorganic materials may include at least one selected from the group consisting of $Pb(Zr,Ti)O_3$ (PZT), $Pb_{1-x}La_xZr_{1-y}Ti_yO_3$ (PLZT), $PB(Mg_3Nb_{2/3})O_3$—$PbTiO_3$ (PMN-PT), $BaTiO_3$, hafnia ($HfO_2$), $SrTiO_3$, $TiO_2$, $Al_2O_3$, $ZrO_2$, $SnO_2$, $CeO_2$, MgO, CaO, ZnO and $Y_2O_3$, without being limited thereto.

The secondary battery may also further include an electrolyte containing operating ions. The electrolyte is not specially limited if it may include operating ions and cause an electrochemical oxidation or reduction reaction at the cathode and the anode by means of the operating ions.

The electrolyte may be a salt having a structure of $A^+B^-$, without being limited thereto. Here, the $A^+$ includes alkali metallic cations such as $Li^+$, $Na^+$, and $K^+$ or their combinations. In addition, $B^-$ includes at least one anion selected from the group consisting of $F^-$, $Cl^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ and $(CF_3CF_2SO_2)_2N^-$.

The electrolyte may also be used in a state of being dissolved in an organic solvent. The organic solvent may use propylene carbonate (PC), ethylene carbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone, or their mixtures.

In an embodiment, the secondary battery may further include a package for sealing the cathode, the anode and the separator. In the case the cathode, the anode and the separator are sealed by the package, the cathode and the anode may be respectively jointed to a cathode terminal and an anode terminal, and the cathode terminal and the anode terminal may be led out of the package. On occasions, in the case the package serves as an electrode terminal, either the cathode terminal or the anode terminal may be replaced with the package. For example, if the anode is electrically connected to the inside of the package, the outer surface of the package may function as an anode. The package is not specially limited if it has chemical stability and may be made of metal, polymer, a flexible pouch film or the like, without being limited thereto. The flexible pouch film may be representatively an aluminum pouch film where a thermal bonding layer, an aluminum layer and an outer protection layer are laminated.

The appearance of the secondary battery is determined by the structure of the package. The package may adopt any structure used in the art and its appearance according to the use of a battery is not specially limited. The package may have structures such as a cylindrical shape, a rectangular shape, a pouch shape, or a coin shape, without being limited thereto.

The secondary battery includes an electrode assembly including unit cells, each having at least a laminated structure of cathode/separator/anode. The unit cell may have various structures known in the art. For example, the unit cell may have a bi-cell structure where outermost electrodes have the same polarity or a full-cell structure where outermost electrodes have opposite polarities. The bi-cell may have a structure of cathode/separator/anode/separator/cathode, for example. The full-cell may have a structure of, for example, cathode/separator/anode/separator/cathode/separator/anode.

The electrode assembly may have various structures known in the art, and for example the electrode assembly may have a simple stack structure where the unit cells and insulating films are repeatedly laminated from the bottom to the top. In addition, the electrode assembly may have a stack folding structure formed by disposing unit cells on an insulative folding film at regular intervals and then rolling the insulative folding film together with the unit cells in a predetermined direction. In addition, the electrode assembly may have a jelly roll structure formed by placing a unit cell prepared in a sheet shape extending in one direction on an insulative rolling film and then rolling the unit cell and the insulative rolling film together.

Experimental Example

Hereinafter, an experimental example which has been performed to verify the effects of the method for estimating a voltage of a secondary battery according to the present disclosure will be described. However, the experimental example is just an example for helping better understanding of the present disclosure, and the subject invention is not limited thereto.

In the experimental example, a voltage of a lithium secondary battery was estimated using the voltage estimating method of the subject invention, and it was checked how much the estimated voltage of the lithium secondary battery is different from a measured voltage of the lithium secondary battery.

A material in which NMC cathode material and LFP cathode material are blended at a ratio of 7:3 (weight ratio) was used as a blended cathode material, and carbon material was used as the anode material. The lithium secondary battery was manufactured in a pouch type using a common manufacture method.

The circuit depicted in FIG. 5 was used as the circuit model, and electrical characteristic values of circuit elements included in the circuit model were set as follows according to SOC of the anode material, the first cathode material and the second cathode material.

Anode Material (Carbon Material) Circuit
$z_a[k]$=0.00 to 1.00
$R_{0\_a}$=0.0005 ohm
$R_a$=0.00029619 ohm
Time constant of the RC circuit $(R_a//C_a)$=1 sec
$Q_a=Q_{cell}$ Resistances of the resistance elements $R_{0\_a}$ and $R_a$ included in the anode material circuit and a time constant of the RC circuit were calculated by making a half cell of the anode material and then applying an impedance measurement method well known in the art for the half cell using an alternating current of 100 Hz. In addition, the capacity $Q_a$ of the anode material was set identical to the capacity $Q_{cell}$ of the lithium secondary battery.

Second Cathode Material (LFP Cathode Material) Circuit
$z_{c2}[k]$=0.00 to 1.00
$R_{0\_c2}$=0.00079494 ohm
$R_{c2}$=0.00128519 ohm
Time constant of the RC circuit $(R_{c2}//C_{c2})$=28 sec
$Q_{c2}=0.2Q_{cell}$ Resistances of the resistance elements $R_{0\_c2}$ and $R_{c2}$ included in the second cathode material circuit and a time constant of the RC circuit were calculated such that the difference between an estimated voltage according to the subject invention and a measured voltage is minimized when $z_{cell}[k]$ of the secondary battery is 0.2 or below.

If $z_{cell}[k]$ decreases to 0.2 or below, the reaction between the NMC cathode material and the lithium ions is substantially completed, and lithium ions are mainly reacted with the LFP cathode material.

Therefore, when the electrical characteristic values is optimized under the condition that $z_{cell}[k]$ is 0.2 or below, the current $i_{c1}[k]$ flowing through the first cathode material circuit is set to be 0.

The capacity $Q_{c2}$ of the second cathode material is set to be 20% of the capacity $Q_{cell}$ of the lithium secondary battery.

First Cathode Material (NMC Cathode Material) Circuit
① $z_{c1}[k]$=0.42 to 1.00
$R_{0\_c1}$=0.000662594 ohm
$R_{c1}$=0.000366817 ohm
Time constant of the RC circuit $(R_{c1}//C_{c1})$=20 sec
$Q_{c1}=0.8Q_{cell}$
② $z_{c1}[k]$=0.00 to 0.42
$R_{0\_c1}=A(z_{c1}[k])^{-4.9414431}$ (A is 0.000662594/$0.42^{-4.9414431}$)
$R_{c1}$=0.000366817 ohm
Time constant of the RC circuit $(R_{c1}//C_{c1})$=20 sec
$Q_{c1}=0.8Q_{cell}$ The electrical characteristic values of the circuit elements included in the first cathode material circuit were set at the last stage. In addition, in regard to the first cathode material circuit, electrical characteristic values of the circuit elements were set by dividing into two SOC ranges.

First, in a range where SOC of the NMC cathode material is 0.42 or above, resistances of the resistance element $R_{0\_c1}$ and $R_{c1}$ and a time constant of the RC circuit were optimized as fixed values such that a difference between an estimated voltage according to the present disclosure and a measured voltage is minimized. At this time, for the electrical characteristic values of the circuit elements included in the anode material circuit and the second cathode material circuit, the values set above were used without change.

Meanwhile, in a range where SOC of the NMC cathode material is smaller than 0.42, resistances of the resistance element $R_{0\_c1}$ and $R_{c1}$ and a time constant of the RC circuit were optimized such that a difference between an estimated voltage according to the present disclosure and a measured voltage is minimized, but the magnitude of the resistance element $R_{0\_c1}$ was exponentially increased as SOC of the NMC cathode material decreases, while keeping the resistance of $R_{c1}$ and the time constant of the RC circuit unchanged.

As described in FIG. 2, in case of a lithium secondary battery containing the blended cathode material in which NMC cathode material and LFP cathode material are blended at a ratio of 7:3 (weight ratio), if SOC decreases near to 40%, the resistance abruptly increases, which is applied to the resistance element $R_{0\_c1}$.

If the magnitude of the resistance element $R_{0\_c1}$ exponentially increases as SOC of the NMC cathode material decreases, the current $i_{c1}[k]$ flowing through the first cathode material circuit rapidly decreases, and most of the current of the secondary battery flows through the second cathode material circuit.

Therefore, if the magnitude of the resistance element $R_{0\_c1}$ exponentially increases in a specific SOC range of the first cathode material, an electrochemical phenomenon in which the kind of cathode material mainly reacting with lithium ions is changed in the specific SOC range may be accurately modeled as a circuit.

Meanwhile, the SOC at which the magnitude of the resistance element $R_{0\_c1}$ starts increasing as an exponential function may be suitably selected according to the kind of blended cathode material. For example, after a discharge voltage profile for a lithium secondary battery containing a blended cathode material is obtained through experiments, SOC corresponding to an inflection point on the discharge voltage profile or SOC near thereto may be selected.

The capacity $Q_{c1}$ of the first cathode material is set to be 80% of the capacity $Q_{cell}$ of the lithium secondary battery.

In this experimental example, after electrical characteristic values of the circuit elements included in the circuit model are set, the lithium secondary battery is pulse-discharged such that SOC of the lithium secondary battery is decreased from 0.53 to 0.10.

At the pulse discharge of the lithium secondary battery, the lithium secondary battery was discharged for 10 seconds in 1 c-rate and then the pulse discharge was paused for 30 seconds. During the pulse discharge, a voltage was estimated at every 0.1 second by applying the voltage estimating method of the present disclosure, and a voltage was measured together at the same time intervals.

Figure 8:
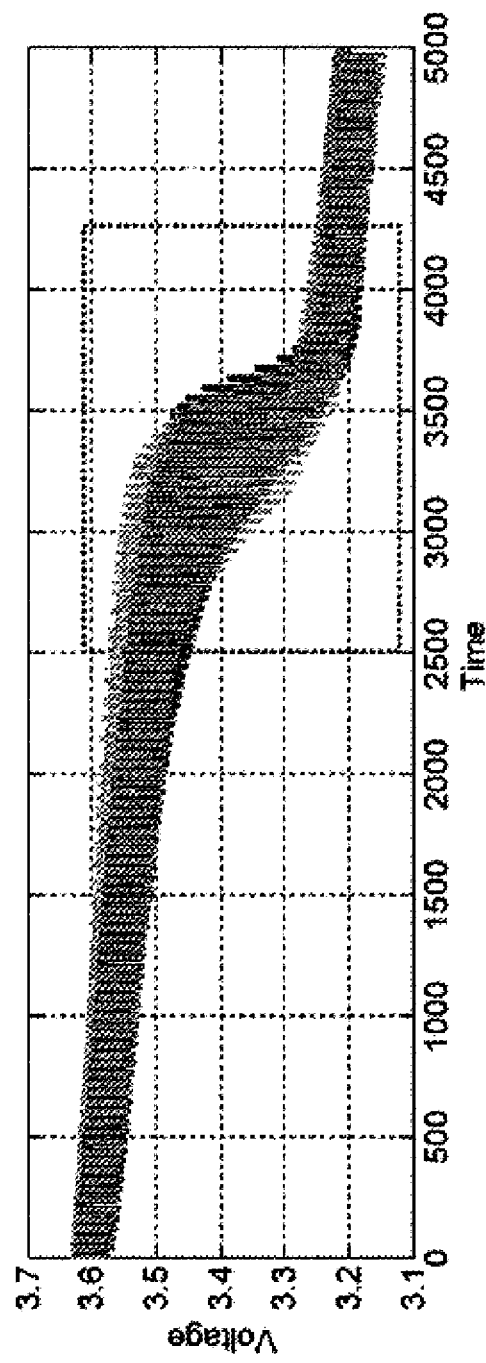
FIG. 8 is a graph showing an estimated voltage of a lithium secondary battery according to an embodiment of the present disclosure together with an actually measured voltage of the lithium secondary battery.

FIG. 8 is a graph showing an estimated voltage (gray color) at this experimental example together with an actually measured voltage (black color).

Referring to FIG. 8, it may be found that the estimated voltage profile is closely matched with an actually measured voltage profile. In particular, it may be understood that the estimated voltage profile closely well matched with the measured voltage profile even in an abnormal voltage behavior region (a dotted rectangular box) where an inflection point occurs while the kind of cathode material mainly reacting with lithium ions is changed. For reference, the inflection point occurs when SOC of the lithium secondary battery is 0.28. A RMS (Root Mean Square) error and a Max error between the estimated voltage profile and the measured voltage profile are calculated to be lower than 10 mV and 60 mV, respectively. Therefore, it may be understood that the method for estimating a voltage of a secondary battery according to the present disclosure may reliably estimate a voltage of a lithium secondary battery containing a blended cathode material which exhibits a voltage change behavior including an inflection point.

Meanwhile, the technical spirit of the present disclosure may be similarly applied to an embodiment in which the cathode has a single cathode material and the anode has two or more anode materials.

For example, the anode of the secondary battery may include first and second anode materials having different operating voltage ranges, and the first anode material may be activated at a lower voltage range (or, at lower SOC) than the second anode material. In other words, if the secondary battery has a low voltage, operating ions may be mainly intercalated into the first anode material, while if the secondary battery has a high voltage, operating ions may be mainly intercalated into the second anode material. In this case, if the SOC of a secondary battery in a charge mode starts increasing from 0%, operating ions are mainly intercalated into the first anode material. In addition, if the capacity of the first anode material to which operating ions may be intercalated is mostly used, operating ions start being intercalated into the second anode material.

The circuit model described above may be easily changed by those skilled in the art by considering that blended anode materials are included in the anode of the secondary battery and a single cathode material is included in the cathode of the secondary battery. In other words, the circuit model used for deriving the voltage estimating model may be replaced with a circuit model including an anode material circuit having a first anode material circuit and a second anode material circuit as well as a cathode material circuit, and the current flowing through each circuit and the voltage formed at a circuit element included in each circuit may be reinterpreted in light of charging the secondary battery, as obvious to those skilled in the art.

In one modified embodiment as above, an anode voltage of a secondary battery may be estimated by the control unit 130 as follows. First, a current of the secondary battery is measured. Thereafter, each current flowing through the first anode material circuit and the second anode material circuit is calculated based on the circuit model while a current of the secondary battery is flowing. Then, an open-circuit voltage according to SOC of the first anode material and optionally an impedance voltage according to an impedance component of the first anode material are calculated based on the current flowing through the first anode material circuit. Similarly, an open-circuit voltage according to SOC of the second anode material and optionally an impedance voltage according to an impedance component of the second anode material are calculated based on the current flowing through the second anode material circuit. The anode voltage may be estimated by using the open-circuit voltage and optionally the impedance voltage calculated for each circuit.

In addition, the technical spirit of the present disclosure may also be similarly applied to an embodiment in which blended cathode materials and blended anode materials are respectively included in the cathode and the anode of the secondary battery. In this case, the circuit model may be replaced with a circuit model including an anode material circuit having a first anode material circuit and a second anode material circuit and a cathode material circuit having a first cathode material circuit and a second cathode material circuit, and the current flowing through each circuit and the voltage formed at a circuit element included in each circuit may be reinterpreted in light of charging or discharging the secondary battery, as obvious to those skilled in the art.

In another modified embodiment, a voltage of a secondary battery may be estimated by the control unit 130 as follows. First, a current of the secondary battery is measured. Thereafter, each current flowing through the first anode material circuit, the second anode material circuit, the first cathode material circuit and the second cathode material circuit based on the circuit model while a current of the secondary battery is flowing. Then, an open-circuit voltage according to SOC of the first anode material and optionally an impedance voltage according to an impedance component of the first anode material based on the current flowing through the first anode material circuit. Similarly, an open-circuit voltage and optionally an impedance voltage for the second anode material, the first cathode material circuit and the second cathode material circuit based on each current flowing through the corresponding circuit. The voltage of the secondary battery may be estimated by using the open-circuit voltage and optionally the impedance voltage calculated for each circuit.

In various embodiments of the present disclosure, components named 'unit' should be understood not as physically distinguishable elements but as functionally distinguishable elements. Therefore, each component may be integrated with another component, selectively, or each component may be divided into sub complements for efficient execution of control logic(s). However, even though components are integrated or divided, such integrated or divided components should be interpreted as being within the scope of the present disclosure if their functions are recognized as having substantially the same identity with the present disclosure, as obvious to those skilled in the art.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A method for estimating a cathode voltage of a secondary battery which includes a cathode comprising a first cathode material and a second cathode material with different operating voltage ranges, the method comprising:
    providing a circuit model comprising a first cathode material circuit and a second cathode material circuit connected to the first cathode material circuit in parallel, each circuit corresponding to the first cathode material and the second cathode material, respectively;
    measuring a current of the secondary battery;
    calculating a current flowing through the first cathode material circuit and the second cathode material circuit based on the circuit model while a current of the secondary battery is flowing;
    calculating an open-circuit voltage according to SOC of the first cathode material and optionally an impedance voltage according to an impedance component of the first cathode material based on the current flowing through the first cathode material circuit;
    calculating an open-circuit voltage according to SOC of the second cathode material and optionally an impedance voltage according to an impedance component of the second cathode material based on the current flowing through the second cathode material circuit; and
    estimating the cathode voltage by using the open-circuit voltage and optionally the impedance voltage calculated for each circuit.

2. The method for estimating a cathode voltage of a secondary battery according to claim 1, further comprising:
    measuring an operation initiating voltage of the secondary battery after the secondary battery initiates charging or discharging; and
    setting initial values of the SOCs of the first cathode material and the second cathode material by using the operation initiating voltage.

3. The method for estimating a voltage of a secondary battery according to claim 1, further comprising:
    setting initial values of an impedance voltage according to the impedance component of the first cathode material and an impedance voltage according to the impedance component of the second cathode material into 0 (zero).

4. The method for estimating a cathode voltage of a secondary battery according to claim 1,
    wherein the SOCs of the first cathode material and the second cathode material are respectively changed by integrating currents flowing through the first cathode material circuit and the second cathode material circuit.

5. The method for estimating a cathode voltage of a secondary battery according to claim 3,
    wherein the impedance voltage according to the impedance component of the first cathode material and the impedance voltage according to the impedance component of the second cathode material are respectively calculated by using an impedance voltage calculation equation derived from a connection relation and an electrical characteristic value of a circuit element constituting the corresponding impedance component.

6. The method for estimating a cathode voltage of a secondary battery according to claim 1,
    wherein the impedance component of each circuit includes at least one circuit element selected from the group consisting of one or more resistance element, one or more capacity element, one or more inductor element and combinations thereof.

7. The method for estimating a cathode voltage of a secondary battery according to claim 1,
    wherein the impedance component of each circuit includes a plurality of circuit elements, and
    wherein the plurality of circuit elements are connected in series and/or in parallel.

8. The method for estimating a cathode voltage of a secondary battery according to claim 1, further comprising:
    storing the estimated cathode voltage of the secondary battery.

9. The method for estimating a cathode voltage of a secondary battery according to claim 1, further comprising:
    outputting the estimated cathode voltage of the secondary battery.

10. The method for estimating a cathode voltage of a secondary battery according to claim 1, further comprising:
    displaying the estimated cathode voltage of the secondary battery.

11. The method for estimating a cathode voltage of a secondary battery according to claim 1, further comprising:
    controlling charging or discharging of the secondary battery by using the estimated cathode voltage of the secondary battery.

12. A method for estimating an anode voltage of a secondary battery which includes an anode comprising a first anode material and a second anode material with different operating voltage ranges, the method comprising:
    providing a circuit model comprising a first anode material circuit and a second anode material circuit connected to the first anode material circuit in parallel, each circuit corresponding to the first anode material and the second anode material, respectively;
    measuring a current of the secondary battery;
    calculating a current flowing through the first anode material circuit and the second anode material circuit based on the circuit model while a current of the secondary battery is flowing;
    calculating an open-circuit voltage according to SOC of the first anode material and optionally an impedance voltage according to an impedance component of the first anode material based on the current flowing through the first anode material circuit;
    calculating an open-circuit voltage according to SOC of the second anode material and optionally an impedance voltage according to an impedance component of the second anode material based on the current flowing through the second anode material circuit; and
    estimating the anode voltage by using the open-circuit voltage and optionally the impedance voltage calculated for each circuit.

13. A method for estimating a voltage of a secondary battery which includes a cathode comprising a first cathode material and a second cathode material with different operating voltage ranges, an anode comprising a first anode material and a second anode material with different operating voltage ranges and a separator configured to separate the cathode and the anode, the method comprising:
    providing a circuit model comprising a first anode material circuit, a second anode material circuit connected to the first anode material circuit in parallel, a first cathode material circuit and a second cathode material circuit connected to the first cathode material circuit in parallel, each circuit corresponding to the first anode material, the second anode material, the first cathode material and the second cathode material, respectively;

measuring a current of the secondary battery;

calculating a current flowing through the first anode material circuit, the second anode material circuit, the first cathode material circuit and the second cathode material circuit based on the circuit model while a current of the secondary battery is flowing;

calculating an open-circuit voltage according to SOC of the first anode material and optionally an impedance voltage according to an impedance component of the first anode material based on the current flowing through the first anode material circuit;

calculating an open-circuit voltage according to SOC of the second anode material and optionally an impedance voltage according to an impedance component of the second anode material based on the current flowing through the second anode material circuit;

calculating an open-circuit voltage formed according to SOC of the first cathode material and optionally an impedance voltage according to an impedance component of the first cathode material based on the current flowing through the first cathode material circuit;

calculating an open-circuit voltage according to SOC of the second cathode material and optionally an impedance voltage according to an impedance component of the second cathode material based on the current flowing through the second cathode material circuit; and estimating the voltage of the secondary battery by using the open-circuit voltage and optionally the impedance voltage calculated for each circuit.

14. A non-transitory computer-readable recording medium, wherein the method for estimating a cathode voltage of a secondary battery according to claim 1 is programmed and recorded.

15. A non-transitory computer-readable recording medium, wherein the method for estimating a cathode voltage of a secondary battery according to claim 12 is programmed and recorded.

16. A non-transitory computer-readable recording medium, wherein the method for estimating a cathode voltage of a secondary battery according to claim 13 is programmed and recorded.

* * * * *